(12) United States Patent
Murooka et al.

(10) Patent No.: US 8,254,160 B2
(45) Date of Patent: Aug. 28, 2012

(54) SEMICONDUCTOR MEMORY DEVICE

(75) Inventors: Kenichi Murooka, Yokkaichi (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/887,043

(22) Filed: Sep. 21, 2010

(65) Prior Publication Data

US 2011/0122676 A1 May 26, 2011

(30) Foreign Application Priority Data

Nov. 24, 2009 (JP) ................................. 2009-266292

(51) Int. Cl.
*G11C 11/00* (2006.01)
(52) U.S. Cl. ........................................ 365/148; 365/226
(58) Field of Classification Search .................. 365/148, 365/226
See application file for complete search history.

(56) References Cited

U.S. PATENT DOCUMENTS 6,754,104 B2 * 6/2004 King ........................ 365/185.14

FOREIGN PATENT DOCUMENTS

| JP | 2008-160004 | 7/2008 |
| WO | WO 2009/157359 A1 | 12/2009 |

OTHER PUBLICATIONS

U.S. Appl. No. 13/327,065, filed Dec. 15, 2011, Murooka.
U.S. Appl. No. 13/313,186, filed Dec. 7, 2011, Murooka.
U.S. Appl. No. 13/051,574, filed Mar. 18, 2011, Murooka, et al.
S. Kimura "Semiconductor Memory: DRAM" Oyo Butsuri, vol. 69, No. 10. Oct. 2000, pp. 1233-1240.
N. Ajika "Flash Memory, Recent Topics", Oyo Butsuri, vol. 69, No. 12, Dec. 2000, pp. 1462-1466.
U.S. Appl. No. 13/001,147, filed Dec. 23, 2010, Murooka.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a semiconductor memory device includes: word lines; bit lines; an insulating film; an interlayer insulating film; and a resistance varying material. The word lines, the bit lines and the insulating film configure a field-effect transistor at each of the intersections of the word lines and the bit lines. The field-effect transistor has one of the word lines as a control electrode and one of the bit lines as a channel region. The field-effect transistor and the resistance varying material configure a memory cell having the field-effect transistor and the resistance varying material connected in parallel. Each of the bit lines includes a first surface opposing the word lines, and a second surface on an opposite side to the first surface. The resistance varying material is disposed in contact with the second surface and has a portion thereof in contact with the interlayer insulating film.

20 Claims, 19 Drawing Sheets

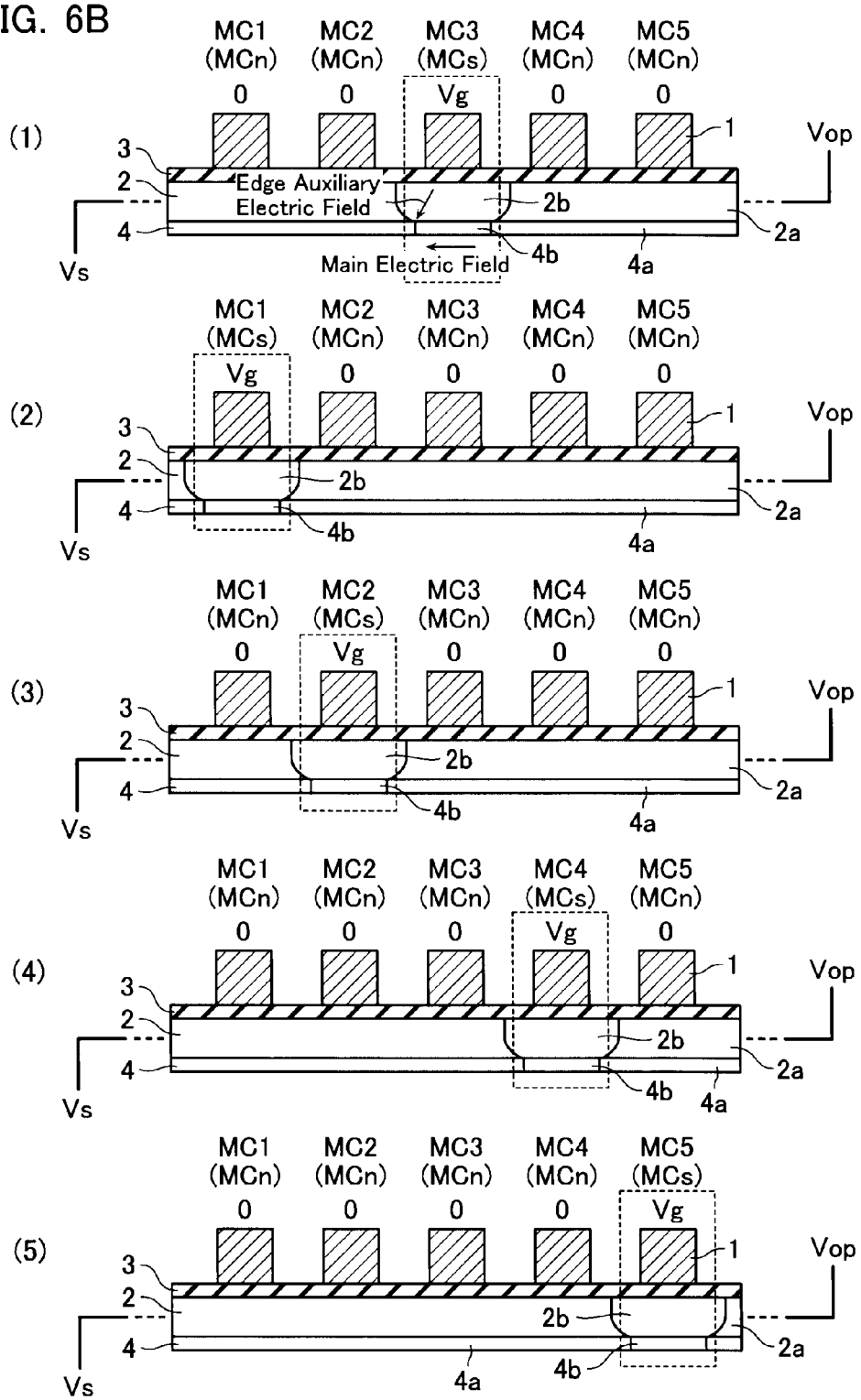

▨ ··· Selected Memory String (Potential Difference V)
▨ ··· Half-Selected Memory String (Potential Difference V/2)
☐ ··· Unselected Memory String (Potential Difference 0)

▨ ··· Selected Memory String
▨ ··· Half-Selected Memory String
☐ ··· Unselected Memory String 93 94 92 93  93 94 92 93

SEMICONDUCTOR MEMORY DEVICE

CROSS REFERENCE TO RELATED APPLICATIONS

This application is based upon and claims the benefit of priority from prior Japanese Patent Application No. 2009-266292, filed on Nov. 24, 2009, the entire contents of which are incorporated herein by reference.

BACKGROUND

1. Field

Embodiments described herein relate generally to a semiconductor memory device.

2. Description of the Related Art

In recent years, along with a rising level of integration in semiconductor devices, circuit patterns of LSI elements configuring these semiconductor devices are being increasingly miniaturized. Required in this miniaturization of the patterns is not simply a thinning of line width but also an improvement in dimensional accuracy and positioning accuracy of the patterns. Semiconductor memory devices are of no exception to this trend, and there is a continued requirement to fully utilize high precision processing technologies to form memory cells where the certain charge necessary for memory is stored in an ever narrower region of the memory cells.

Conventionally, various kinds of memories such as DRAM, SRAM, and flash memory are manufactured, all of which use a MOSFET as a memory cell. These memories require, along with miniaturization of the patterns, an improvement in dimensional accuracy and positioning accuracy at a rate that exceeds a rate of the miniaturization. The large burden is placed additionally on lithography technology, which is used to form the patterns. Lithography processing costs account for the vast majority of current costs of mass production. The requirement for miniaturization of the patterns is a factor contributing to a rise in lithography processing costs, that is, to a rise in product cost. At the same time, in recent years, a memory known as a resistance varying memory (ReRAM: Resistive RAM) is proposed as a technology for overcoming such problems, a memory cell in the ReRAM being configured by a selection element, which comprises a non-ohmic element typified by a diode, and a resistance varying material. This ReRAM does not utilize storage of a charge in data retention and can be configured without using a MOSFET as a memory cell, and is thus expected to allow high levels of integration exceeding those of conventional trends to be achieved. Arranging the memory cell array of the ReRAM three-dimensionally in stacks makes it possible to realize a large capacity in the ReRAM without increasing cell array area.

Moreover, the ReRAM allows a high density memory cell array to be realized by provision of a cross-point type structure in which a variable resistor and a rectifier such as a diode are disposed at intersections of bit lines and word lines. However, there is a problem with the cross-point type structure of ReRAM utilizing a diode in the memory cell, namely that the sum of reverse leak current when a voltage is applied in a reverse bias direction of the diode gives rise to significantly large power consumption. Furthermore, when a NOR-type structure are adopted by providing a MOSFET to each of the memory cells to reduce power consumption, it becomes impossible to reduce size of the memory cell region to less than $6F^2$, making it difficult to cut cost per bit.

BRIEF DESCRIPTION OF THE DRAWINGS

FIG. 6B is a schematic view for explaining operation of the semiconductor memory device in accordance with the first embodiment.

DETAILED DESCRIPTION

According to one embodiment, a semiconductor memory device includes: a semiconductor substrate; a plurality of word lines; a plurality of bit lines; an insulating film; an interlayer insulating film; and a resistance varying material. The word lines are extending in a first direction parallel to a surface of the semiconductor substrate and disposed in parallel in a second direction parallel to the surface of the semiconductor substrate and orthogonal to the first direction. The bit lines are extending in the second direction and disposed in parallel in the first direction to intersect the word lines. The insulating film is disposed at each of intersections of the word lines and the bit lines. The interlayer insulating film is configured to fill a gap between the word lines and a gap between the bit lines. The resistance varying material is formed to extend in the second direction and configured to be electrically connected to the bit lines and to change between a low resistance state and a high resistance state. The word lines, the bit lines and the insulating film configure a field-effect transistor at each of the intersections of the word lines and the bit lines. The field-effect transistor has one of the word lines as a control electrode and one of the bit lines as a channel region. The field-effect transistor and the resistance varying material configure a memory cell having the field-effect transistor and the resistance varying material connected in parallel to the field-effect transistor. Each of the bit lines includes a first surface opposing the word lines with the insulating film interposed therebetween, and a second surface on an opposite side to the first surface. The resistance varying material is disposed in contact with the second surface and has a portion thereof in contact with the interlayer insulating film. Embodiments of a semiconductor memory device in accordance with the present invention are described below with reference to the drawings.

First Embodiment

[Configuration of Semiconductor Memory Device in Accordance with First Embodiment]

Figure 1:
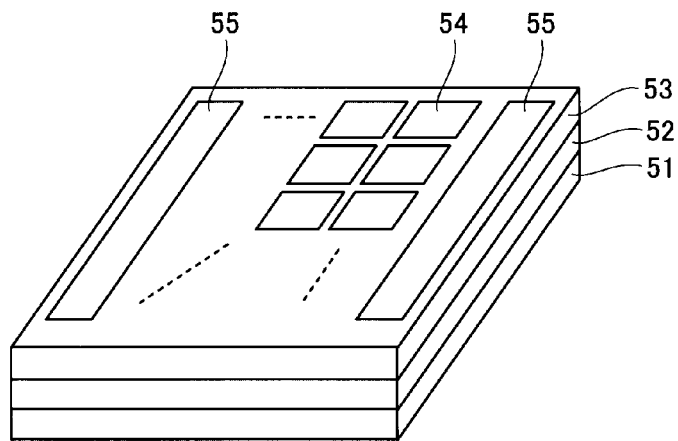
FIG. 1 is a perspective view showing an overall configuration of a semiconductor memory device in accordance with a first embodiment.

FIG. 1 is a perspective view showing an overall configuration of a semiconductor memory device in accordance with a first embodiment. Formed on an ordinary silicon (Si) substrate 51 by generally used processes is a CMOS circuit 52 including a wiring layer. Formed on the CMOS circuit 52 by generally used processes is a layer 53 including a plurality of memory cell units 54.

The CMOS circuit 52 is designed and produced with, for example, a 90 nm design rule which is looser than that for wirings of the memory cell unit 54 except for a connecting portion with the memory cell unit 54. One memory cell unit 54 occupies an approximately 11 μm square region, and includes intersections of 256×256 lines. Provided in a periphery of each memory cell unit 54 is an electrical connecting portion with the CMOS circuit 52 (not shown). Blocks, each comprising the memory cell unit 54 and peripheral electrical connecting portion as one unit, are disposed in a matrix. Furthermore, the layer 53 which includes the memory cell units 54 is provided with through-holes (not shown). The electrical connecting portions of the memory cell units 54 are connected to the CMOS circuit 52 via the through-holes. Operation of the memory cell units 54 is controlled by the CMOS circuit 52. An input/output unit 55 of the semiconductor memory device includes terminals having electrical coupling with an input/output unit of the CMOS circuit 52. These terminals also are connected to the input/output unit of the CMOS circuit 52 via the aforementioned through-holes. Data, commands, addresses, and so on, required by the CMOS circuit 52 for controlling operation of the memory cell units 54 are exchanged with external via the input/output unit 55. The input/output unit 55 is formed at an end of the layer 53 including the memory cell units 54 (refer to FIG. 1).

Such a configuration enables an insulating film formed in the memory cell unit 54 to serve as a protective film of the CMOS circuit 52. In addition, since the memory cell units 54 and the CMOS circuit 52 in the present embodiment are coupled in a stacking direction, it becomes possible to reduce operating time and significantly increase a number of memory cells capable of simultaneous read/write, without an accompanying increase in chip area. Note that the input/output unit 55 of the memory device is bonded to a lead frame in a packaging process, similarly to a conventional semiconductor memory device.

Figure 2:
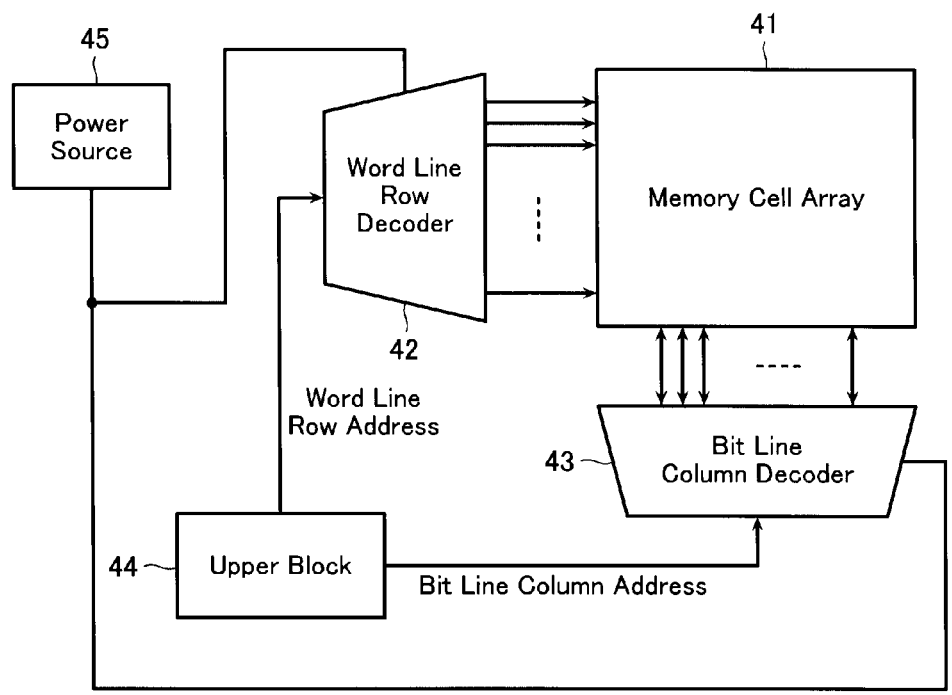
FIG. 2 is a block diagram of the semiconductor memory device in accordance with the first embodiment.

FIG. 2 is a block diagram of the semiconductor memory device in accordance with the present embodiment. The semiconductor memory device includes a memory cell array 41, the memory cell array 41 including a plurality of row lines and a plurality of column lines intersecting these row lines, and having memory cells disposed at respective intersections of the row lines and column lines. The memory cell unit 54 shown in FIG. 1 corresponds to this memory cell array 41. In the following description, the row lines are referred to as word lines and the column lines are referred to as bit lines, in accordance with a conventional semiconductor memory device.

In addition, the semiconductor memory device comprises a word line row decoder 42 for selecting word lines and a bit line column decoder 43 for selecting bit lines. The bit line column decoder 43 includes drivers for controlling read, write, and erase operations. Moreover, the semiconductor memory device comprises an upper block 44 which is a control circuit configured to supply a word line row address and a bit line column address respectively to the word line row decoder 42 and the bit line column decoder 43, thereby selecting the memory cell within the memory cell array 41 on which read/write is to be performed, and to control each of read, write, and erase operations. A power source 45 generates combinations of certain voltages for handling the respective operations of read, write, and erase, and supplies these voltages to the word line row decoder 42 and the bit line column decoder 43. This configuration makes it possible to read, write, and erase information in all memory cells connected to an identical word line in one lot. Circuits referred to as peripheral circuits, each including the word line row decoder 42, the bit line column decoder 43, and the upper block 44 of FIG. 2, are provided in the CMOS circuit 52 shown in FIG. 1.

Figure 3:
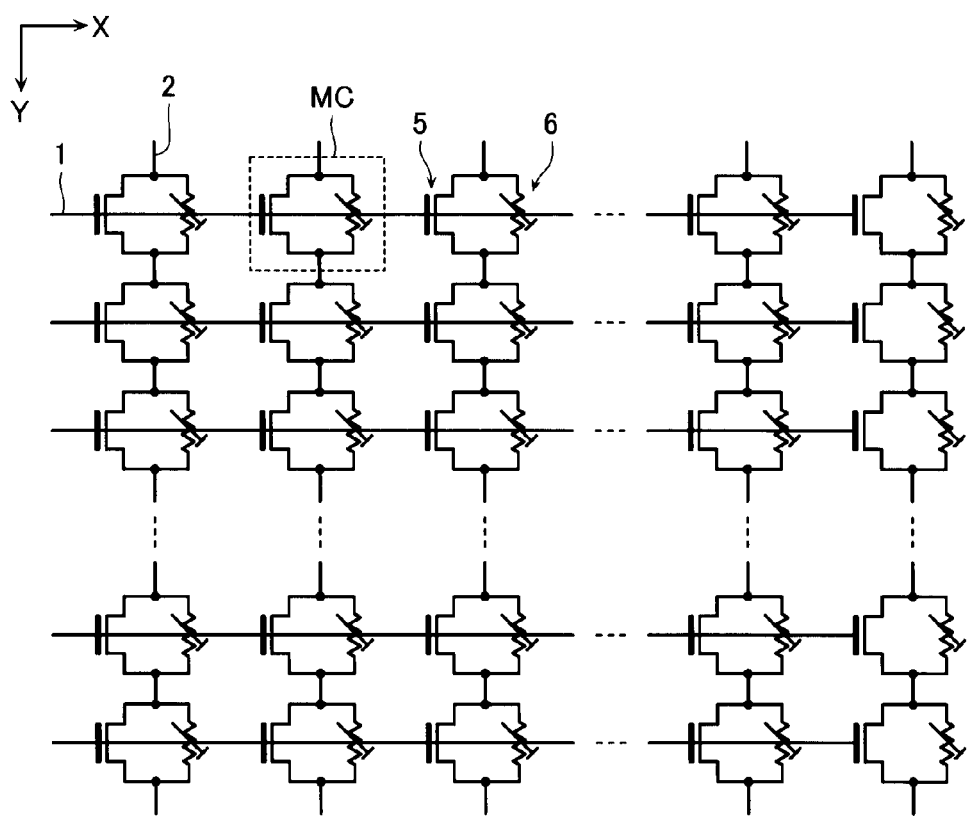
FIG. 3 is an equivalent circuit diagram of a memory cell array of the semiconductor memory device in accordance with the first embodiment.

FIG. 3 is an equivalent circuit diagram of the memory cell array 41 of the semiconductor memory device in accordance with the present embodiment. The memory cell array 41 shown in FIG. 3 comprises a plurality of word lines 1 and a plurality of bit lines 2 disposed to intersect these word lines 1. Provided at each of intersections of the word lines 1 and bit lines 2 is a memory cell MC. In the present embodiment, a channel portion of a transistor 5 in the memory cell MC also configures a portion of the bit line 2. The memory cell MC is a resistance varying type memory cell having a selection element, such as a transistor 5, and a variable resistance element 6 connected in parallel. Gate electrodes of a plurality of the transistors 5 aligned in an X direction of FIG. 3 are commonly connected to the word line 1. Moreover, a plurality of the memory cells MC are connected in series in a Y direction of FIG. 3, an end of this series-connected plurality of memory cells MC being connected to the bit line 2. In the present embodiment, 256 pieces of the word lines 1 and 256 pieces of the bit lines 2 are provided, whereby approximately 65K memory cells MC are arranged in a two-dimensional matrix in the memory cell array.

Figure 4A:
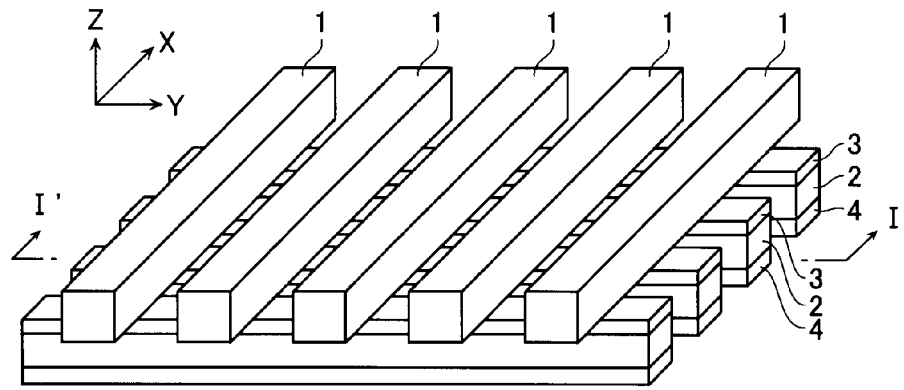
FIG. 4A is a perspective view showing a part of the memory cell array of the semiconductor memory device in accordance with the first embodiment.
Figure 4B:
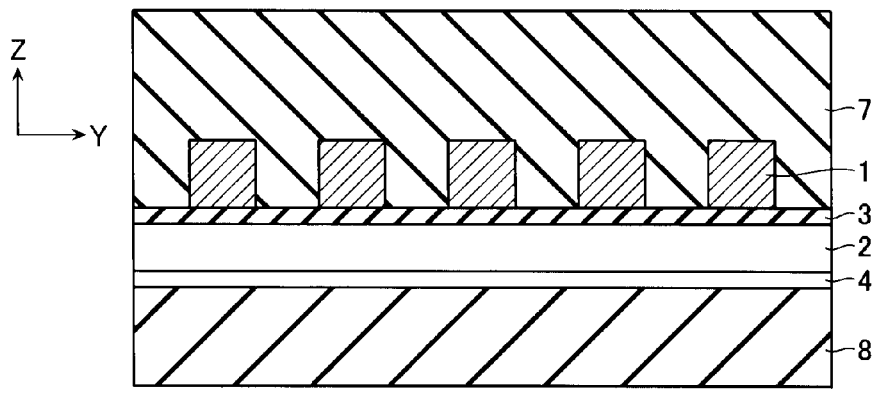
FIG. 4B is a cross-sectional view showing a part of the memory cell array of the semiconductor memory device in accordance with the first embodiment.
Figure 4C:
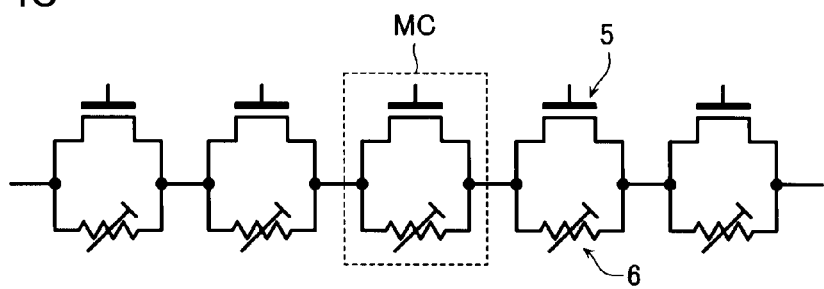
FIG. 4C is an equivalent circuit diagram showing a part of the memory cell array of the semiconductor memory device in accordance with the first embodiment.

FIGS. 4A, 4B, and 4C are, respectively, a perspective view, a cross-sectional view, and an equivalent circuit diagram showing a part of the memory cell array shown in FIG. 3. FIG. 4B is a cross-sectional view taken along the line I-I' of FIG. 4A. Note that interlayer insulating films 7 and 8 to be described hereafter are omitted from FIG. 4A.

As shown in FIGS. 4A and 4B, in the memory cell array 41, the plurality of word lines 1 are formed to extend in the X direction and disposed in parallel in the Y direction. Also, the plurality of bit lines 2 are formed to extend in the Y direction and disposed in parallel in the X direction. The word lines 1 and the bit lines 2 oppose each other in an intersecting manner. Disposed between the word and bit lines is an insulating film 3 configured from such as silicon oxide ($SiO_2$). The word line 1 is configured from such as silicon (Si) including a high concentration impurity showing a metallic conductivity, and the bit line 2 is configured from such as a p-type semiconductor silicon (Si) of low impurity concentration. The word line 1, bit line 2, and insulating film 3 form a MOSFET having the word line 1 as a gate electrode and the bit line 2 as a channel. Further, on an opposite side (second side) to a side (first side) of the bit line 2 facing the word line 1 and provided with the insulating film 3 is a resistance varying material 4 constituted mainly from carbon. The bit line 2 and the resistance varying material 4 are electrically connected.

The MOSFET formed by the word line 1, bit line 2, and insulating film 3, and the resistance varying material 4 on an under side of the MOSFET form a single memory cell MC. The equivalent circuit diagram of the memory cell MC is shown in FIG. 4C. As shown in the equivalent circuit diagram of FIG. 4C, the memory cell MC is configured having the transistor 5 and the variable resistance element 6 connected in parallel, and a plurality of the memory cells MC are connected in series to configure a memory string.

In addition, as shown in FIG. 4B, the memory cell array 41 is isolated from lower layer lines including the substrate and upper layer lines by interlayer insulating films 7 and 8 configured from such as silicon oxide ($SiO_2$). In such a structure, the bit line 2 and the resistance varying material 4 are not applied with an electric field other than a desired electric field. Furthermore, by having the resistance varying material 4 opposing the word line 1 with the bit line 2 interposed therebetween (by having the resistance varying material 4 separated from the word line 1 by the bit line 2), an electric field formed by the word line 1 is partially shielded by the bit line 2. In such a structure, an influence of the voltage applied to the word line 1 on the resistance varying material 4 is limited.

Space between each of the word lines 1 and bit lines 2 is also filled in by the interlayer insulating films 7 and 8. Accordingly, the resistance varying material 4 provided under the bit line 2 is in contact with the interlayer insulating layers 7 and 8.

Now, the resistance varying material 4 is a material configured to change between at least two resistance states of a low resistance state and a high resistance state. The resistance varying material 4 is known to change from the high resistance state to the low resistance state upon application of a voltage of a certain value or more, and to change from the low resistance state to the high resistance state upon flow of a current of a certain value or more.

As shown in FIG. 4A, the semiconductor memory device of the present embodiment has a so-called cross-point type configuration in which memory cells MC are formed at the intersections of the word lines 1 and the bit lines 2. In this configuration, the word lines 1 and bit lines 2 simply adopt a line-and-space pattern, and the only requirement for a positional relationship between the word lines 1 and bit lines 2 is that they intersect each other in an orthogonal manner. There is no need to consider misalignment in the word line direction and the bit line direction. It is thus possible for alignment accuracy in the memory cell array in a manufacturing process to be relaxed to a high degree, whereby manufacturing can be easily performed. Further, this structure is a high integration structure in which one bit of information can be stored in a $4F^2$ region.

Next, electrical connecting portions at both ends of the bit line 2 are described.

Figure 5A:
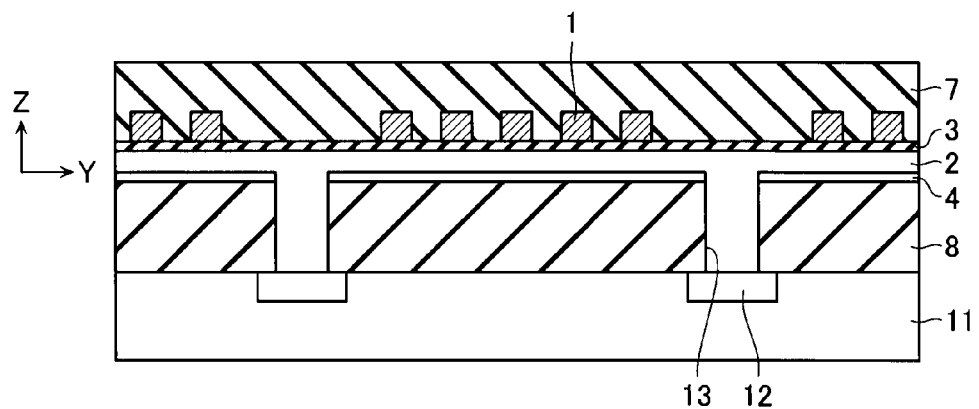
FIG. 5A is a cross-sectional view showing a part of the memory cell array of the semiconductor memory device in accordance with the first embodiment.
Figure 5B:
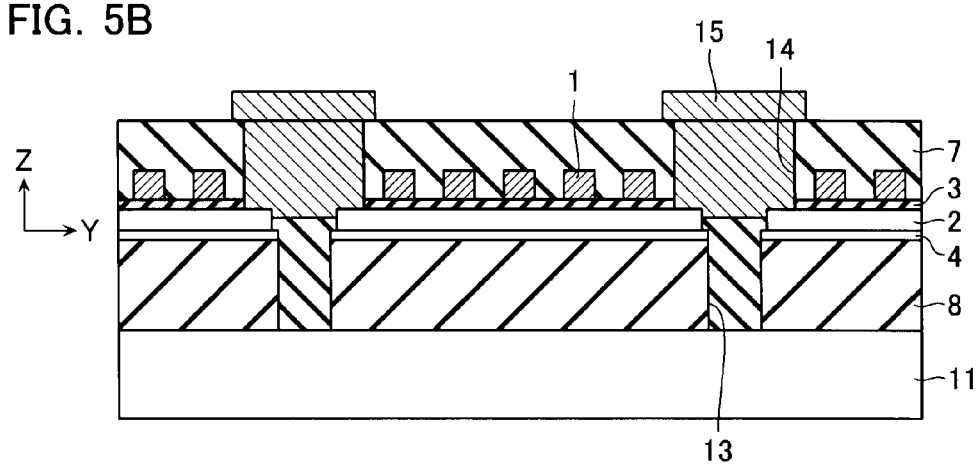
FIG. 5B is a cross-sectional view showing a part of the memory cell array of the semiconductor memory device in accordance with the first embodiment.

FIGS. 5A and 5B are cross-sectional views of the semiconductor memory device in accordance with the present embodiment. FIGS. 5A and 5B show respective configuration examples of the electrical connecting portions at both ends of the bit line 2. Now, FIGS. 5A and 5B are cross-sectional views in a direction corresponding to the I-I' line cross-section of FIG. 4A, and show a cross-section including to the ends of the bit line 2. Moreover, parts in FIGS. 5A and 5B having an identical configuration to parts in FIGS. 4A and 4B are assigned with identical symbols, and duplicative description omitted.

As mentioned above, the bit line 2 is configured from semiconductor silicon (Si) of low impurity concentration. Monocrystalline silicon is known to have better characteristics as a silicon semiconductor than amorphous or polycrystalline silicon. It is thus desirable for crystallization transformation from an amorphous phase to a monocrystalline phase utilizing solid phase epitaxial growth to be performed also for the semiconductor silicon used in the bit line 2. At this time, a silicon portion of the substrate can be utilized as a seed crystallization portion for the monocrystalline silicon.

FIG. 5A shows an example where a connecting portion with the substrate utilized in solid phase epitaxial growth is used, as is, as connecting wiring, and FIG. 5B shows an example where the connecting portion with the substrate utilized in solid phase epitaxial growth is cut away and a separate connecting wiring provided. Configuration and method of manufacturing for each of the examples is described below.

In the configuration example shown in FIG. 5A, a diffusion layer wiring portion 12, having a wiring line formed by diffusing an impurity, is provided on a silicon (Si) substrate 11. The end of the bit line 2 extending from the memory cell portion is connected to the diffusion layer wiring portion 12 via silicon filling an opening 13 configured to penetrate the resistance varying material 4 and the interlayer insulating film 8. In the case of the present example, the diffusion layer wiring portion 12 is connected to external.

A method of manufacturing the electrical connecting portions at both ends of the bit line 2 in the configuration example shown in FIG. 5A is simply described. First, the diffusion layer wiring portion 12 is formed beforehand on the silicon (Si) substrate 11, and the interlayer insulating film 8 configured from such as silicon oxide ($SiO_2$) and the resistance varying material 4 are deposited on the substrate 11 and the diffusion layer wiring portion 12. Next, a photolithography process is used to form the opening 13 linking to a top of the diffusion layer wiring portion on the substrate 11, and amorphous silicon is deposited. Then, the deposited amorphous silicon undergoes solid phase epitaxial growth using the substrate 11 for seed crystallization, thereby forming the bit line 2. The silicon in the opening 13 is made low resistance by applying ion injection and activated annealing, and used, as is, as the wiring line. The insulating film 3 and the word line 1 are formed similarly to a conventional CMOS process, and the interlayer insulating film 7 may also be formed by a conventional technique. Although this method requires using a diffusion layer wiring having a relatively large resistance, there is an advantage of the method that the number of processes is reduced.

In the configuration example shown in FIG. 5B, there is no diffusion layer wiring portion 12 provided on the silicon (Si) substrate 11. The end of the bit line 2 extending from the memory cell portion is connected to a metal wiring portion 15 via metal filling an opening 14 configured to penetrate the interlayer insulating film 7. In the case of the present example, the metal wiring portion 15 is connected to external.

A method of manufacturing the electrical connecting portions at both ends of the bit line 2 in the configuration example shown in FIG. 5B is simply described. First, the interlayer insulating film 8 configured from such as silicon oxide ($SiO_2$) and the resistance varying material 4 are deposited on the silicon (Si) substrate 11. In such a state, a photolithography process is used to form the opening 13 linking to a top of the substrate 11, and amorphous silicon is deposited. Then, the deposited amorphous silicon undergoes solid phase epitaxial growth using the substrate 11 for seed crystallization, thereby forming the bit line 2. A photolithography process is used here again to form a resist pattern including an opening slightly larger than the opening 13, and a RIE (Reactive Ion Etching) process used to remove silicon in the opening 13 by etching. Next, subsequent to the insulating film 3 and the word line 1 being formed similarly to a conventional CMOS process, the interlayer insulating film 7 is formed. At this time, an insulating film is formed simultaneously inside the opening 13. Furthermore, subsequent to planarization of an upper side of the interlayer insulating film 7 using a conventional CMP (Chemical Mechanical Polishing) process, a conventional wiring process is used to form the opening 14 and a metal connecting portion. Subsequently, the metal wiring portion 15 is formed on the interlayer insulating film 7 and the bit line 2 is connected to a desired portion of the underlying CMOS circuit. Note this wiring process also enables connection between the word line 1 and the underlying CMOS circuit to be performed. Although the number of processes are increased in this method, there is an advantage of the method that metal wiring of relatively low resistance can be used leading to a large degree of freedom in wiring.

[Operation of Semiconductor Memory Device in Accordance with First Embodiment]

Figure 6A:
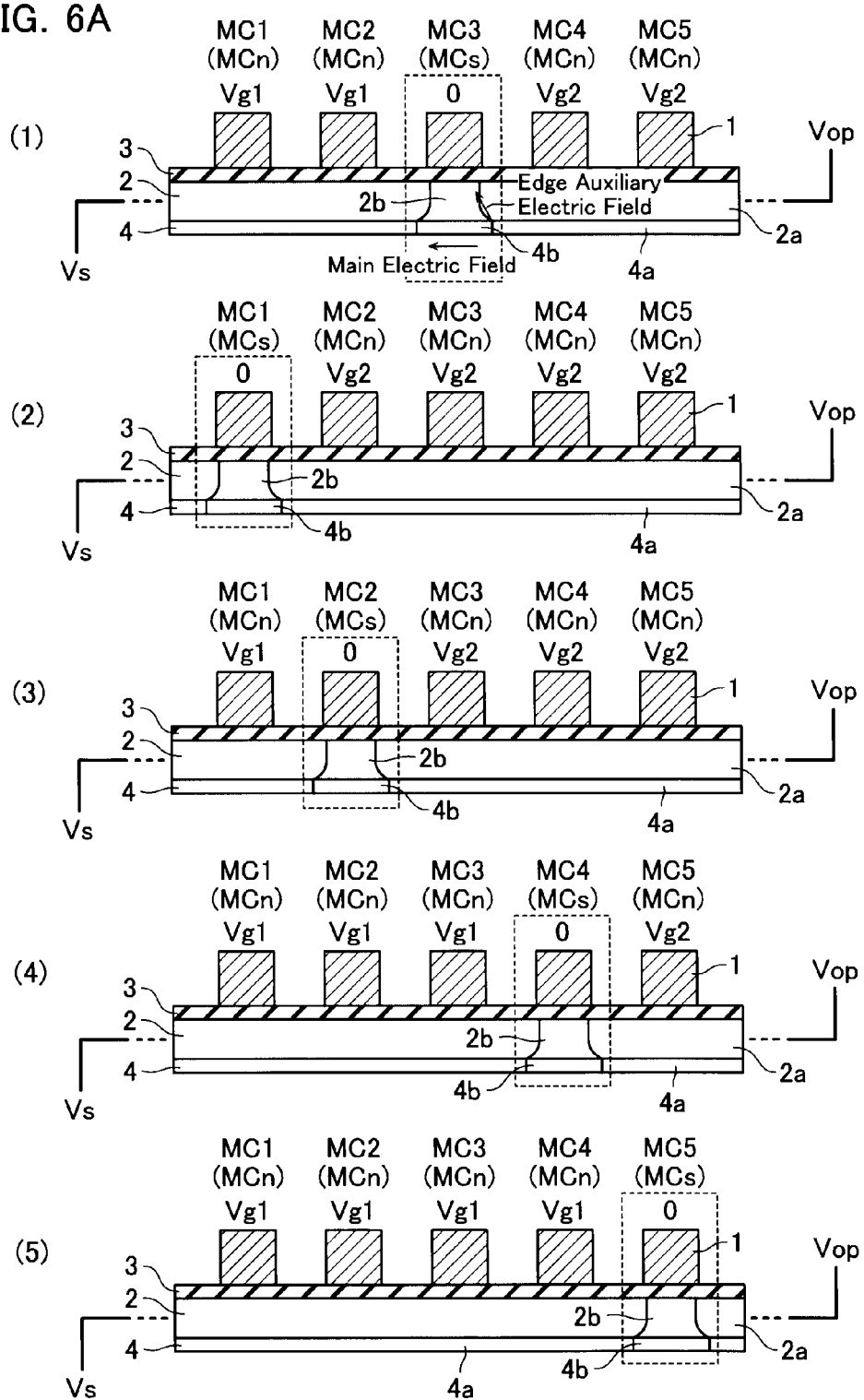
FIG. 6A is a schematic view for explaining operation of the semiconductor memory device in accordance with the first embodiment.

Next, operation of the semiconductor memory device in accordance with the present embodiment formed as above is described with reference to FIGS. 6A and 6B. FIGS. 6A and 6B are schematic views for explaining operation of the semiconductor memory device in accordance with the present embodiment. FIGS. 6A and 6B also are schematic views of a cross-section corresponding to the I-I' line cross-section of FIG. 4A.

In operation of the semiconductor memory device, a MOSFET is used to select one specific memory cell MC only from a plurality of memory cells MC aligned in series in the bit line direction, and read, write, and erase operations are executed on that selected memory cell MC only.

FIG. 6A is a cross-sectional schematic view of the semiconductor memory device in accordance with the present embodiment. Now, the semiconductor silicon forming the bit line 2 in FIG. 6A is assumed to have an impurity concentration setting such that the MOSFET configuring the memory cell MC is of a normally-off enhancement type. That is, the MOSFET of the memory cell MC shifts to an insulative state having a low channel conductivity when a voltage applied to the word line 1 configuring the gate electrode is close to 0 V. Moreover, when the voltage applied to the word line 1 is a positive threshold voltage or more, sufficient carriers are induced in the channel portion and the MOSFET shifts to a conductive state having a high channel conductivity.

A memory cell MC3 shown in (1) of FIG. 6A surrounded by a broken line is a selected memory cell MCs. In operation of the semiconductor memory device shown in FIG. 6A as an example, a voltage applied to the word line 1 corresponding to the selected memory cell MCs is set to 0 V (a voltage less than the threshold voltage Vth at which the MOSFET becomes conductive). The other word lines 1 (word lines 1 corresponding to unselected memory cells MCn) are applied with voltages Vg1 or Vg2 greater than or equal to the threshold voltage Vth at which the MOSFET is conductive. Now, voltage values of these voltages satisfy: voltage Vg2>voltage Vg1>threshold voltage Vth. In this case, a portion 2b of the bit line 2 directly below the selected word line 1 remains insulative and a portion 2a of the bit line 2 other than directly below the selected word line 1 is rendered conductive.

In this state, a reference voltage Vs and an operating voltage Vop are applied to the two ends of the bit line 2 via the aforementioned wiring portions. Now, the operating voltage Vop is greater than the reference voltage Vs. Due to this voltage application, most of a voltage difference between the operating voltage Vop and the reference voltage Vs is applied to the portion 2b directly below the selected word line 1 and to a certain portion 4b of the resistance varying material 4. Moreover, a part of the resistance varying material 4 is in contact with the interlayer insulating film 8 and is not completely surrounded by the bit line 2. As a result, the certain portion 4b of the resistance varying material 4 is applied not only with a main electric field applied directly from the bit line 2 based on the voltage difference between the operating voltage Vop and the reference voltage Vs but is also indirectly applied with an auxiliary electric field (leak electric field) from the word line 1 via the interlayer insulating films 7 and 8.

Further, a current flowing between the two ends of the bit line 2 becomes substantially identical to a current flowing in the certain portion 4b of the resistance varying material 4. This means that controlling the voltage applied to the two ends of the bit line 2 and the current flowing in the bit line 2 allows the voltage applied to and current flowing in the certain portion 4b of the resistance varying material 4 to be controlled and measured. As a result, control of the resistance state of the certain portion 4b of the resistance varying material 4, that is, read, write, and erase, become executable independently of another portion 4a of the resistance varying material 4.

For example, when performing read, a voltage difference Vop−Vs between the operating voltage Vop and the reference voltage Vs is set to a read voltage Vread. This read voltage Vread is used to measure a current value flowing in the bit line 2 and determine whether the current value is greater than or equal to a reference value. This allows determination of whether a resistance value of the certain portion 4b of the resistance varying material 4 is the high resistance state or the low resistance state, and a bit value to be assigned.

Moreover, when performing write, the voltage difference Vop−Vs is set to a setting voltage Vset. Application of the setting voltage Vset allows transiting of the certain portion 4b of the resistance varying material 4 from the high resistance state to the low resistance state.

Furthermore, when performing erase, the voltage difference Vop−Vs is set to a resetting voltage Vreset. Application of the resetting voltage Vreset allows transiting of the certain portion 4b of the resistance varying material 4 from the low resistance state to the high resistance state.

As shown in (2)-(5) of FIG. 6A, when accessing other memory cells MC (MC1, MC2, MC4, and MC5) above the bit line 2 and resistance varying material 4, voltages applied to each of the word lines 1 are changed. Shown in (2)-(5) of FIG. 6A are voltage application states when the memory cells MC1, MC2, MC4, and MC5 are respectively set as the selected memory cell MCs. That is, an operation need only be performed in which the voltage applied to the word line 1 corresponding to the memory cell MC newly set as the selected memory cell MCs is set to 0 V, and the other word lines 1 are applied with the voltages Vg1 or Vg2 greater than or equal to the threshold voltage.

Now, since the reference voltage Vs and the operating voltage Vop applied to the two ends of the bit line 2 differ, a potential of the channel region of the selected memory cell MCs differs on left and right sides of the certain portion 2b of the bit line 2. Due to this, voltages applied to the word lines 1 corresponding to the unselected memory cells MCn are divided into two types, namely the voltage Vg1 and the voltage Vg2. Since variation in the potential of the channel causes the threshold voltage of the MOSFET to change, a low voltage side (reference voltage Vs side) from the selected word line 1 is applied with the relatively low gate voltage Vg1, and a high voltage side (operating voltage Vop side) is applied with the relatively high gate voltage Vg2. This allows desired operations to be executed reliably.

Moreover, in the above operations, to deal with the case when the gate voltage of the MOSFET configuring each of the memory cells MC is 0 V (that is, when the MOSFET is non-conductive), a source-drain breakdown voltage (punch-through voltage) must be set greater than a maximum value of the voltage applied to the certain portion 4b (maximum value of the voltage that may be applied to the certain portion 4b) of the resistance varying material 4. Furthermore, to deal with the case where all the other memory cells MC on the same bit line 2 are in the high resistance state, it is desirable for the channel resistance of the certain portion 2a of the conductive-rendered bit line 2 to be significantly less than the resistance value of the resistance varying material 4 in a high resistance state, so as to avoid IR drop in the voltage applied to the selected memory cell MC.

In addition, it is even more desirable for the channel resistance of the certain portion 2a of the conductive-rendered bit line 2 to be significantly less than the resistance value of the resistance varying material 4 in a low resistance state. If the channel resistance of the certain portion 2a is less than the resistance value of the resistance varying material 4 in a low resistance state, influence of the resistance value of other unselected memory cells MC can be eliminated in a read operation of a cell current value of the selected memory cell MC, leading to the advantage that read margin is increased.

FIG. 6B is a cross-sectional schematic view of the semiconductor memory device in accordance with the present embodiment. Now, the semiconductor silicon forming the bit line 2 in FIG. 6B is assumed to have an impurity concentration setting such that the MOSFET configuring the memory cell MC is of a normally-on depletion type. That is, the MOSFET of the memory cell MC shifts to a conductive state having a high channel conductivity due to residual carriers even when a voltage applied to the word line 1 configuring the gate electrode is close to 0 V. Moreover, when a certain voltage is applied to the word line 1, the carriers disappear and the MOSFET shifts to an insulative state having a low channel conductivity.

When the semiconductor silicon forming the bit line 2 is of a p-type, the certain portion 2b is caused to shift to an insulative state by a voltage of the word line 1 configuring the gate electrode greater than or equal to the positive threshold voltage Vth (Vg>Vth>0). On the other hand, when the semiconductor silicon forming the bit line 2 is on an n-type, the certain portion 2b is caused to shift to an insulative state by the voltage of the word line 1 configuring the gate electrode less than or equal to the negative threshold voltage Vth (Vg<Vth<0).

A memory cell MC3 shown in (1) of FIG. 6B surrounded by a broken line is a selected memory cell MCs. In operation of the semiconductor memory device shown in FIG. 6B as an example, a voltage applied to the word line 1 corresponding to the selected memory cell MCs is set to a voltage Vg (a voltage greater than the threshold voltage Vth at which the MOSFET becomes insulative). The other word lines 1 (word lines 1 corresponding to unselected memory cells MCn) are applied with a voltage 0 V. In this case, only the portion 2b of the bit line 2 directly below the selected word line 1 becomes insulative, and the portion 2a of the bit line 2 other than directly below the selected word line 1 is left conductive.

In this state, the reference voltage Vs and the operating voltage Vop are applied to the two ends of the bit line 2 via the aforementioned wiring portions. Most of the voltage difference between the operating voltage Vop and the reference voltage Vs is applied to the portion 2b directly below the selected word line 1 and to the certain portion 4b of the resistance varying material 4. Moreover, a part of the resistance varying material 4 is in contact with the interlayer insulating film 8 and is not completely surrounded by the bit line 2. As a result, the certain portion 4b of the resistance varying material 4 is applied not only with the main electric field applied directly from the bit line 2 based on the voltage difference between the operating voltage Vop and the reference voltage Vs but is also indirectly applied with the auxiliary electric field (leak electric field) from the word line 1 via the interlayer insulating films 7 and 8.

Further, the current flowing between the two ends of the bit line 2 becomes substantially identical to the current flowing in the certain portion 4b of the resistance varying material 4. This means that controlling the voltage applied to the two ends of the bit line 2 and the current flowing in the bit line 2 allows the voltage applied to and current flowing in the certain portion 4b of the resistance varying material 4 to be controlled and measured. As a result, control of the resistance state of the certain portion 4b of the resistance varying material 4, that is, read, write, and erase, become executable independently of the other portion 4a of the resistance varying material 4.

As shown in (2)-(5) of FIG. 6B, when accessing other memory cells MC (MC1, MC2, MC4, and MC5) above the bit line 2 and resistance varying material 4, voltages applied to each of the word lines 1 are changed. Shown in (2)-(5) of FIG. 6B are voltage application states when the memory cells MC1, MC2, MC4, and MC5 are respectively set as the selected memory cell MCs. That is, an operation need only be performed in which the voltage applied to the word line 1 corresponding to the memory cell MC newly set as the selected memory cell MCs is set to Vg, and the voltage applied to the other word lines 1 is set to 0 V. Other operations may be performed in a completely identical manner to the example described using FIG. 6A.

[Advantages of Semiconductor Memory Device in Accordance with First Embodiment]

The semiconductor memory device of the present embodiment enables realization of a memory cell array having an extremely simple pattern for the memory cell portion and having a structure that does not include difficult-to-form contact holes for each cell. In addition, since the memory cell MC does not include a diode, it becomes possible to suppress power consumption caused by reverse direction leak current of the diodes in unselected memory cells MC. Further, since the line-and-space pattern of the word lines 1 and bit lines 2 can be used to form the MOSFETs, high integration can be achieved at a lower production cost than when NOR-type architecture is employed.

Moreover, during operation of the semiconductor memory device, not only is the main electric field due to the voltages applied to the two ends of the bit line generated in the certain portion 4b of the resistance varying material 4, but also the auxiliary electric field (leak electric field) is generated between the word line 1 and the certain portion 4b of the resistance varying material 4. Due to these two electric fields being generated, a desired voltage can be reliably applied to the resistance varying material 4, thereby preventing incorrect operation.

Second Embodiment

[Configuration of Semiconductor Memory Device in Accordance with Second Embodiment]

Figure 7:
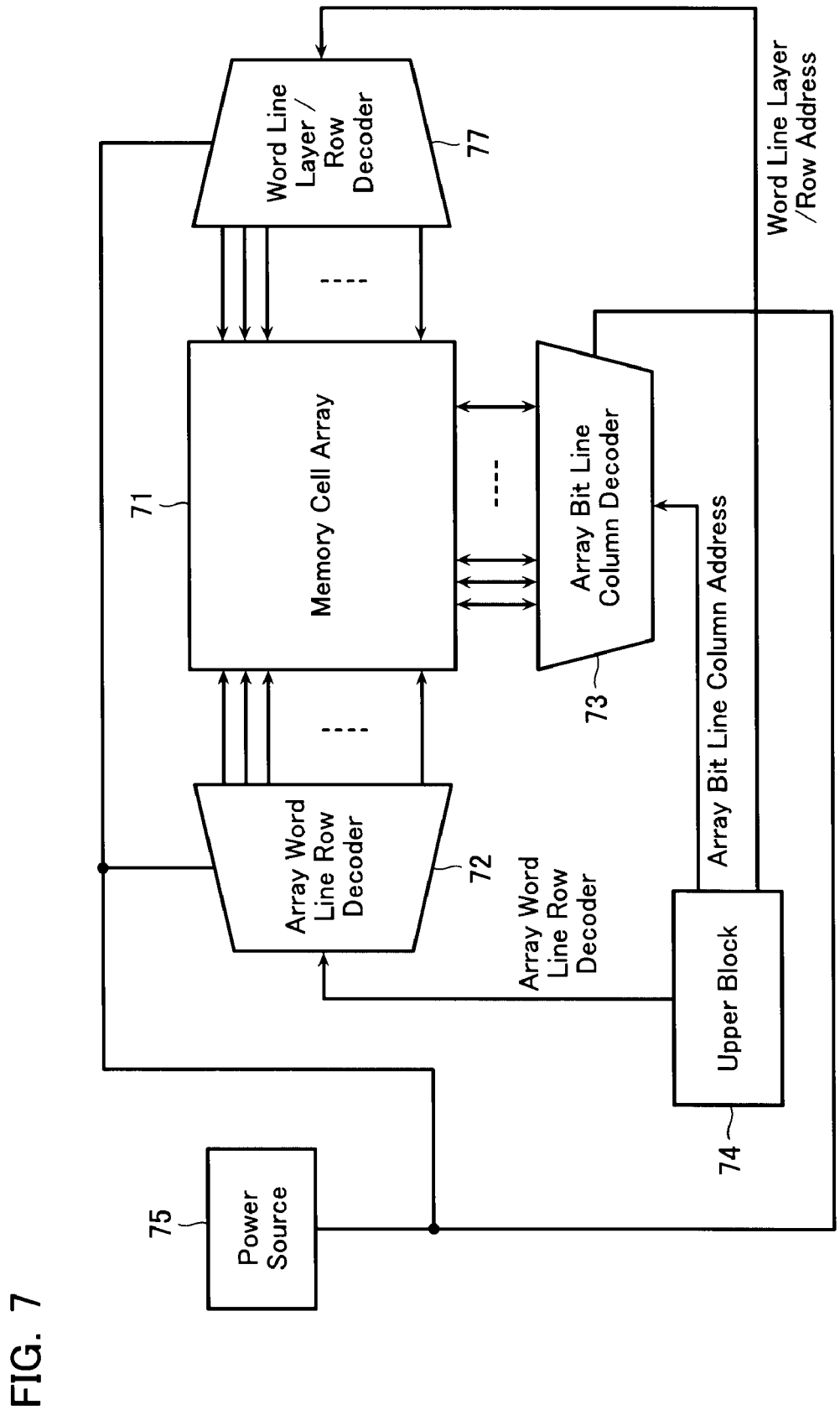
FIG. 7 is a block diagram of a semiconductor memory device in accordance with a second embodiment.

FIG. 7 is a block diagram of a semiconductor memory device in accordance with the present embodiment. This semiconductor memory device includes a memory cell array 71 including a plurality of word lines and a plurality of bit lines intersecting the word lines and having a memory cell MC disposed at respective intersections of the word lines and the bit lines. The memory cell array 71 of the present embodiment differs from the first embodiment in having the memory cell array configured three-dimensionally. In addition, the memory cell array 71 of the present embodiment differs from the memory cell array 41 of the first embodiment also in comprising array word lines and array bit lines used in control of the memory cell array. Configurations of this memory cell array, the array word lines and array bit lines, and the word lines and bit lines are described in detail hereafter.

The semiconductor memory device comprises an array word line row decoder 72 for selecting the array word lines of the memory cell array 71 and an array bit line column decoder 73 for selecting the array bit lines of the memory cell array 71. The array bit line column decoder 73 includes drivers for controlling the read, write, and erase operations. The semiconductor memory device further comprises a word line layer/row decoder for selecting the word lines. In addition, the semiconductor device comprises an upper block 74 which is a control circuit configured to select the array word line, array bit line, and word line connected to the memory cell MC subject to execution of read and write in the memory cell array 71, and to control each of the operations of read, write, and erase. The upper block 74 supplies an array word line row address, an array bit line column address, and a word line layer/row address to, respectively, the array word line row decoder 72, the array bit line column decoder 73, and the word line layer/row decoder 77. A power source 75 generates combinations of certain voltages corresponding to the respective operations of read, write, and erase, and supplies these voltages to the array word line row decoder 72, the array bit line column decoder 73, and the word line layer/row decoder 77. This configuration makes it possible to read, write, and erase information in all memory cells MC connected to an identical word line of a certain layer in one lot.

Figure 8A:
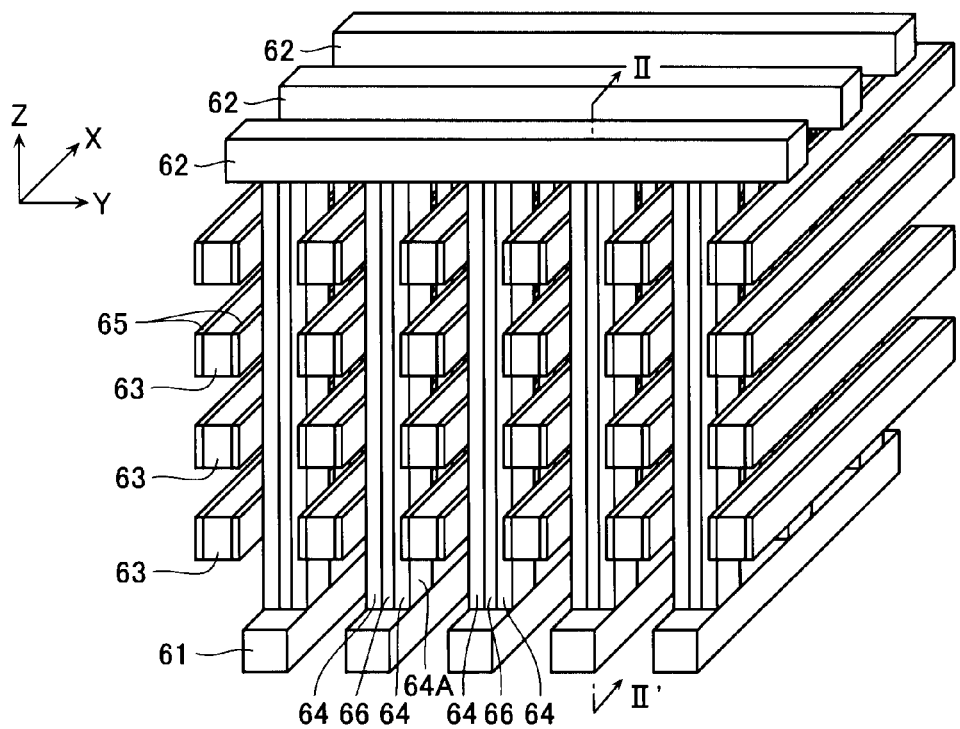
FIG. 8A is a perspective view showing a part of a memory cell array of the semiconductor memory device in accordance with the second embodiment.
Figure 8B:
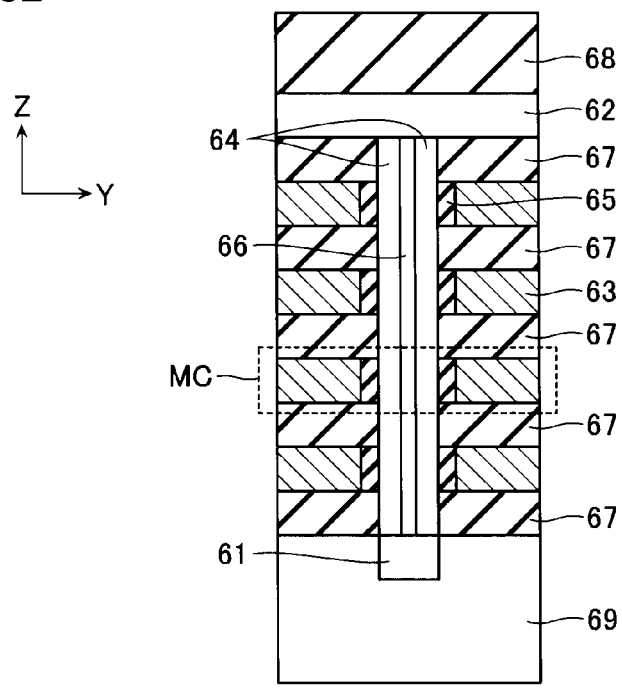
FIG. 8B is a cross-sectional view showing a part of the memory cell array of the semiconductor memory device in accordance with the second embodiment.

FIGS. 8A and 8B are, respectively, a perspective view and a cross-sectional view showing a part of the memory cell array 71 shown in FIG. 7. FIG. 8B is a cross-sectional view taken along the line II-II' of FIG. 8A. Note that interlayer insulating films 67 and 68 to be described hereafter are omitted from FIG. 8A.

As shown in FIGS. 8A and 8B, the memory cell array is provided with a plurality of word lines 63 extending in an X direction of FIG. 8A and disposed in parallel in a Y direction and a Z direction of FIG. 8A, and a plurality of bit lines 64 extending in the Z direction and disposed in parallel in the X direction and the Y direction. The word lines 63 and the bit lines 64 are disposed alternately in the Y direction. The bit lines 64 are formed in a column shape sandwiching a thin-film resistance varying material 66 constituted mainly from carbon. There is electrical connection between the bit line 64 and the resistance varying material 66. This column-shaped bit line 64 intersects the word line 63 such that a first side surface is in contact with the resistance varying material 66, while a second side surface opposite to the first side surface (side surface 64A in FIG. 8A) oppose the word line 63. Disposed along the word line 63 on a Y direction side surface of the word line 63 is an insulating film 65 configured from such as silicon oxide (SiO$_2$). That is, the word line 63 is in contact with the bit line 64 via the insulating film 65.

In the first embodiment, the word lines 1 and the bit lines 2 are each disposed in parallel with the substrate surface. In contrast, in the present embodiment, while the word lines 63 are disposed in parallel with the substrate surface and over a plurality of layers, the bit lines 64 are formed extending in a perpendicular direction with respect to the substrate surface. The memory cell array is thereby configured three-dimensionally.

Furthermore, connected to lower ends in the Z direction of the bit lines 64 are a plurality of array word lines 61 extending in the X direction and disposed in parallel in the Y direction. Moreover, connected to upper ends in the Z direction of the bit lines 64 are a plurality of array bit lines 62 extending in the Y direction and disposed in parallel in the X direction. The array word lines 61 and the array bit lines 62 are disposed to be in a mutually orthogonal relationship.

The word line 63 is configured from such as silicon (Si) including a high concentration impurity showing a metallic conductivity, and the bit line 64 is configured from a p-type semiconductor silicon (Si) of low impurity concentration. The word line 63, bit line 64, and insulating film 65 form a MOSFET having the word line 63 as a gate electrode and the bit line 64 as a channel.

The MOSFET formed by the word line 63, bit line 64 and insulating film 65, and the resistance varying material 66 formed sandwiched by the bit lines 64 form a single memory cell MC. In the present embodiment, as shown by a broken line in FIG. 8B, the single memory cell MC is configured by the two opposing MOSFETs sandwiching the resistance varying material 66 and the resistance varying material 66 sandwiched between those two MOSFETs. A plurality of the memory cells MC are connected in series in the Z direction to configure a memory string.

Moreover, as shown in FIG. 8B, the memory cell array is isolated from lower layer wiring including the substrate and upper layer wiring by interlayer insulating films 67 and 68 configured from such as silicon oxide ($SiO_2$). In such a structure, the bit line and the resistance varying material 66 are not applied with an electric field other than a desired electric field. Furthermore, due to the resistance varying material 66 being disposed sandwiched by the bit lines 64 (the resistance varying material 66 being isolated from the word line 63 by the bit line 64), the electric field formed by the word line 63 is partially shielded by the bit line 64. In such a structure, an influence of the voltage applied to the word line 63 on the resistance varying material 66 is limited.

Space between each of the word lines 63 and bit lines 64 is also filled in by the interlayer insulating films 67 and 68. As a result, the resistance varying material 66 provided sandwiched by the bit lines 64 is in contact with the interlayer insulating layer 67 at X direction side surfaces.

Diffusion layer wiring formed on a crystalline silicon (Si) substrate 69 may be used as the array word line 61. Moreover, the array word line 61 and array bit line 62 may use ordinary metal wiring or may be configured from silicon (Si) including a high concentration of phosphorus or the like, and showing metal conductivity. In the case of using the metal wiring, there is an advantage that line resistance can be reduced. In addition, when a silicon (Si) type wiring is used in the lower layer portion array word line 61, there is an advantage that little mixing of metal type impurities occurs during formation of the bit line 64 and that base wiring can be employed as a crystalline nucleus.

As shown in FIG. 8A, the semiconductor memory device of the present embodiment is configured having the array word lines 61 and array bit lines 62 in an orthogonal positional relationship. In the case of this configuration, the array word lines 61 and the array bit lines 62 need only have line-and-space patterns, and there is no need to consider misalignment in the X direction and Y direction. It is thus possible for alignment accuracy in the memory cell array in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

[Operation of Semiconductor Memory Device in Accordance with Second Embodiment]

Figure 9A:
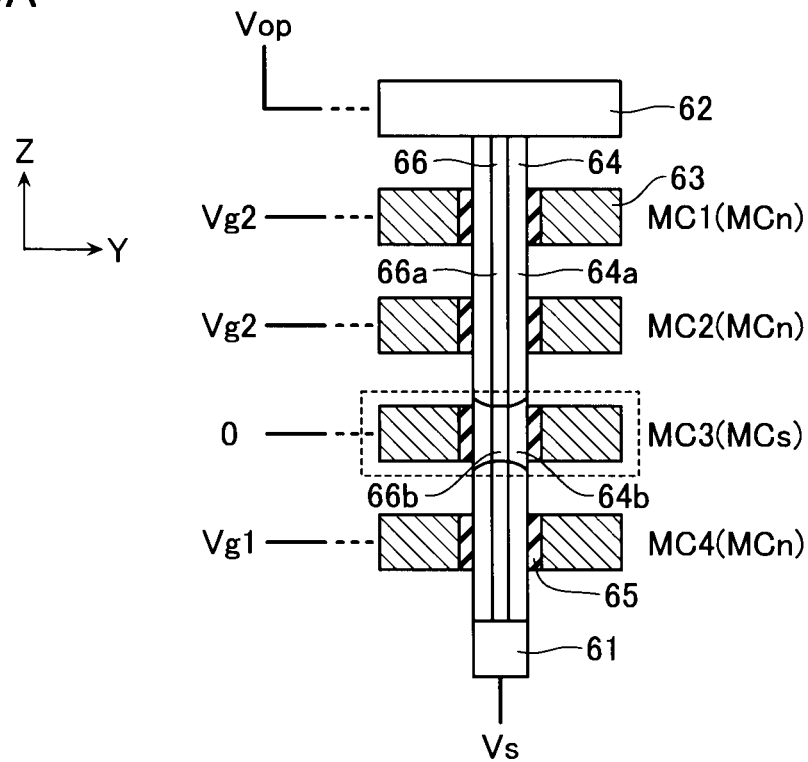
FIG. 9A is a schematic view for explaining operation of the semiconductor memory device in accordance with the second embodiment.
Figure 9B:
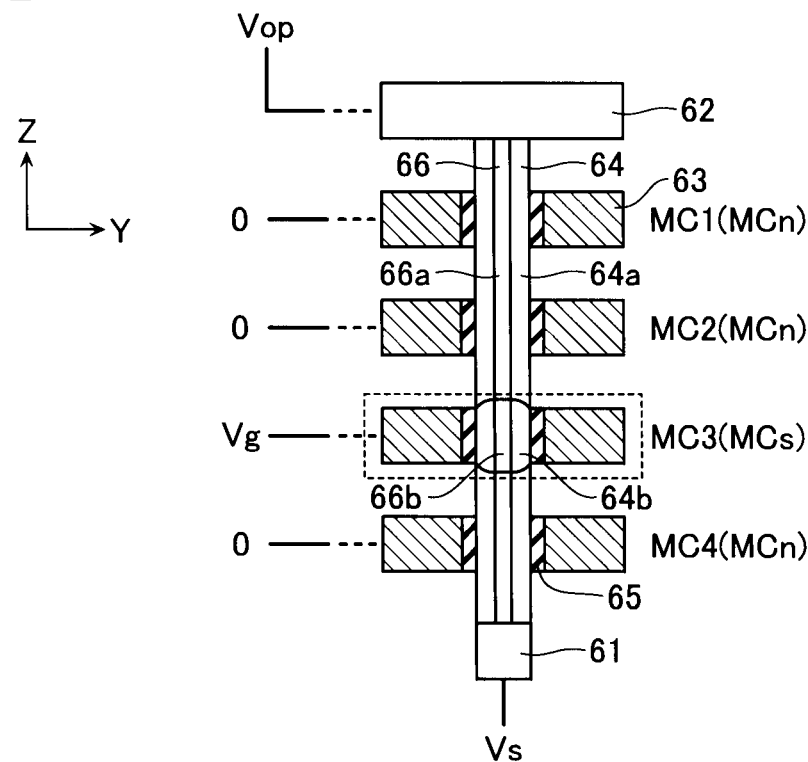
FIG. 9B is a schematic view for explaining operation of the semiconductor memory device in accordance with the second embodiment.

Next, operation of the semiconductor memory device in accordance with the present embodiment formed as above is described with reference to FIGS. 9A and 9B. FIGS. 9A and 9B are schematic views for explaining operation of the semiconductor memory device in accordance with the present embodiment. FIGS. 9A and 9B also are schematic views of a cross-section corresponding to the II-II' line cross-section of FIG. 8A.

In operation of the semiconductor memory device, a MOSFET is used to select one specific memory cell MC only from a plurality of memory cells MC aligned in series in the bit line direction, and read, write, and erase operations are executed on that selected memory cell MC only.

FIG. 9A is a cross-sectional schematic view of the semiconductor memory device in accordance with the present embodiment. Now, the semiconductor silicon forming the bit line 64 in FIG. 9A is assumed to have an impurity concentration setting such that the MOSFET configuring the memory cell MC is of a normally-off enhancement type. That is, the MOSFET of the memory cell MC shifts to an insulative state having a low channel conductivity when a voltage applied to the word line 63 configuring the gate electrode is close to 0 V. Moreover, when the voltage applied to the word line 63 is a positive threshold voltage or more, sufficient carriers are induced in the channel portion and the MOSFET shifts to a conductive state having a high channel conductivity.

A memory cell MC3 shown in FIG. 9A surrounded by a broken line is a selected memory cell MCs. In operation of the semiconductor memory device shown in FIG. 9A as an example, a voltage applied to the word line 63 corresponding to the MOSFET configuring the selected memory cell MCs is set to 0 V (a voltage less than the threshold voltage Vth at which the MOSFET becomes conductive). Moreover, the other word lines 63 (word lines 63 corresponding to unselected memory cells MCn) are applied with voltages Vg1 or Vg2 greater than or equal to the threshold voltage Vth at which the MOSFET is conductive. Now, voltage values of these voltages satisfy: voltage Vg2>voltage Vg1>threshold voltage Vth. In this case, a portion 64b of the bit line 64 corresponding to the selected word line 63 remains insulative and a portion 64a of the bit line 64 which is a portion other than the portion 64b corresponding to the selected word line 63 is rendered conductive.

In this state, a reference voltage Vs and an operating voltage Vop are applied to the two ends of the bit line 64 via the array word line 61 and the array bit line 62. Now, the operating voltage Vop is greater than the reference voltage Vs. Due to this voltage application, most of a voltage difference between the operating voltage Vop and the reference voltage Vs is applied to the portion 64b corresponding to the selected word line 63 and to a certain portion 66b of the resistance varying material 66. Further, a current flowing between the two ends of the bit line 64 becomes substantially identical to a current flowing in the certain portion 66b of the resistance varying material 66. This means that controlling the voltage applied to the two ends of the bit line 64 and the current flowing in the bit line 64 allows the voltage applied to and current flowing in the certain portion 66b of the resistance varying material 66 to be controlled and measured. As a result, control of the resistance state of the certain portion 66b of the resistance varying material 66, that is, read, write, and erase, become executable independently of another portion 66a of the resistance varying material 66.

Moreover, in the present embodiment, a part of the resistance varying material 66 is in contact with the interlayer insulating film 67 and is not completely surrounded by the bit line 64. As a result, the certain portion 66b of the resistance varying material 66 is applied not only with a main electric field applied directly from the bit line 64 based on the voltage difference between the operating voltage Vop and the reference voltage Vs but is also indirectly applied with an auxiliary electric field (leak electric field) from the word line 63 via the interlayer insulating film 67.

Now, since the reference voltage Vs and the operating voltage Vop applied to the two ends of the bit line 64 differ, a potential of the channel region of the selected memory cell MCs differs on upper and lower sides of the certain portion 64b of the bit line 64. Due to this, voltages applied to the word lines 63 corresponding to the unselected memory cells MCn are divided into two types, namely the voltage Vg1 and the voltage Vg2. Since variation in the potential of the channel causes the threshold voltage of the MOSFET to change, a low voltage side (reference voltage Vs side) from the selected word line 63 is applied with the relatively low gate voltage Vg1, and a high voltage side (operating voltage Vop side) is applied with the relatively high gate voltage Vg2. This allows desired operations to be executed reliably.

FIG. 9B is a cross-sectional schematic view of the semiconductor memory device in accordance with the present embodiment. Now, the semiconductor silicon forming the bit line 64 in FIG. 9B is assumed to have an impurity concentration setting such that the MOSFET configuring the memory cell MC is of a normally-on depletion type. That is, the MOSFET of the memory cell MC shifts to a conductive state having a high channel conductivity due to residual carriers even when a voltage applied to the word line 63 configuring the gate electrode is close to 0 V. Moreover, when a certain voltage is applied to the word line 63, the carriers disappear and the MOSFET shifts to an insulative state having a low channel conductivity.

When the semiconductor silicon forming the bit line 64 is of a p-type, the certain portion 64b is caused to shift to an insulative state by a voltage of the word line 63 configuring the gate electrode greater than or equal to the positive threshold voltage Vth (Vg>Vth>0). On the other hand, when the semiconductor silicon forming the bit line 64 is of an n-type, the certain portion 64b is caused to shift to an insulative state by the voltage of the word line 63 configuring the gate electrode less than or equal to the negative threshold voltage Vth (Vg<Vth<0).

A memory cell MC3 shown in FIG. 9B surrounded by a broken line is a selected memory cell MCs. In operation of the semiconductor memory device shown in FIG. 9B as an example, a voltage applied to the word line 63 corresponding to the MOSFET configuring the selected memory cell MCs is set to a voltage Vg (a voltage greater than the threshold voltage Vth at which the MOSFET becomes insulative). Now, the voltage Vg is applied to the word lines 63 forming the gate electrodes of the two opposing MOSFETs sandwiching the resistance varying material 66. Moreover, the other word lines 63 (word lines 63 corresponding to unselected memory cells MCn) are applied with a voltage 0 V. In this case, only the portion 64b of the bit line 64 corresponding to the selected word line 63 becomes insulative, and the portion 64a of the bit line 64 which is the portion other than the portion 64b corresponding to the selected word line 63 is left conductive.

In this state, the reference voltage Vs and the operating voltage Vop are applied to the two ends of the bit line 64 via the array word line 61 and the array bit line 62. Most of the voltage difference between the operating voltage Vop and the reference voltage Vs is applied to the portion 64b corresponding to the selected word line 63 and to the certain portion 66b of the resistance varying material 66. Further, the current flowing between the two ends of the bit line 64 becomes substantially identical to the current flowing in the certain portion 66b of the resistance varying material 66. This means that controlling the voltage applied to the two ends of the bit line 64 and the current flowing in the bit line 64 allows the voltage applied to and current flowing in the certain portion 66b of the resistance varying material 66 to be controlled and measured. As a result, control of the resistance state of the certain portion 66b of the resistance varying material 66, that is, read, write, and erase, become executable independently of the other portion 66a of the resistance varying material 66.

Moreover, in the present embodiment, a part of the resistance varying material 66 is in contact with the interlayer insulating film 67 and is not completely surrounded by the bit line 64. As a result, the certain portion 66b of the resistance varying material 66 is applied not only with the main electric field applied directly from the bit line 64 based on the voltage difference between the operating voltage Vop and the reference voltage Vs but is also indirectly applied with an auxiliary electric field (leak electric field) from the word line 63 via the interlayer insulating film 67.

Figure 9C:
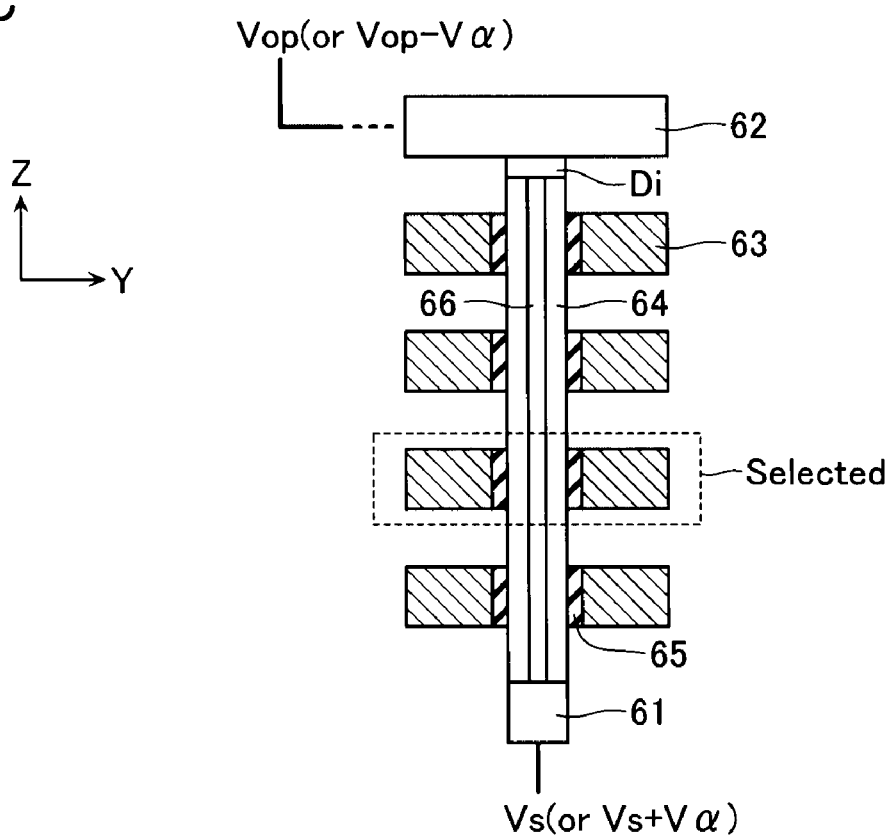
FIG. 9C is a schematic view for explaining operation of the semiconductor memory device in accordance with the second embodiment.

Note that control of access to a specific bit line (and the resistance varying material 66 sandwiched by the specific bit line 64) can be performed using the array word line 61 and the array bit line 62, similarly to a conventional cross-point type memory. For example, a non-ohmic element such as a diode Di is disposed between the array bit line 62 and the bit line 64 (or between the array word line 61 and the bit line 64), as shown in FIG. 9C. Then, when the positive operating voltage Vop is applied to the selected array bit line 62 and the reference voltage Vs applied to the selected array word line 61, it is only required to apply the reference voltage Vs to unselected array bit lines 62 and the operating voltage Vop to unselected array word lines 61.

The voltage applied to the unselected array word lines 61 and array bit lines 62 may also be adjusted using an offset voltage Vα based on the threshold voltage of the diode characteristics. Setting the voltage applied to the unselected array bit lines to Vs+Vα and the voltage applied to the unselected array word lines to Vop−Vα enables the reverse bias voltage applied to diodes attached to bit lines (memory strings) other than the specified bit line 64 (memory string) to be reduced by an amount of 2×Vα. As a result, leak current occurring in memory strings other than the selected bit line (selected memory string) can be lowered, and power consumption in the memory cell array overall can be reduced.

Alternatively, if an innovation such as that described below is applied to the connecting portions of the array word line 61 and array bit line 62 with the underlying CMOS circuit, then read, write, and erase operations on a specific bit line 64 (selected memory string) become possible, without providing a non-ohmic element such as the diode Di to each of the bit lines 64 (each of the memory strings). A method for applying read, write, and erase voltages to a selected memory string using the array word line 61 and the array bit line 62 is described below with reference to FIGS. 10 to 13.

Figure 10:
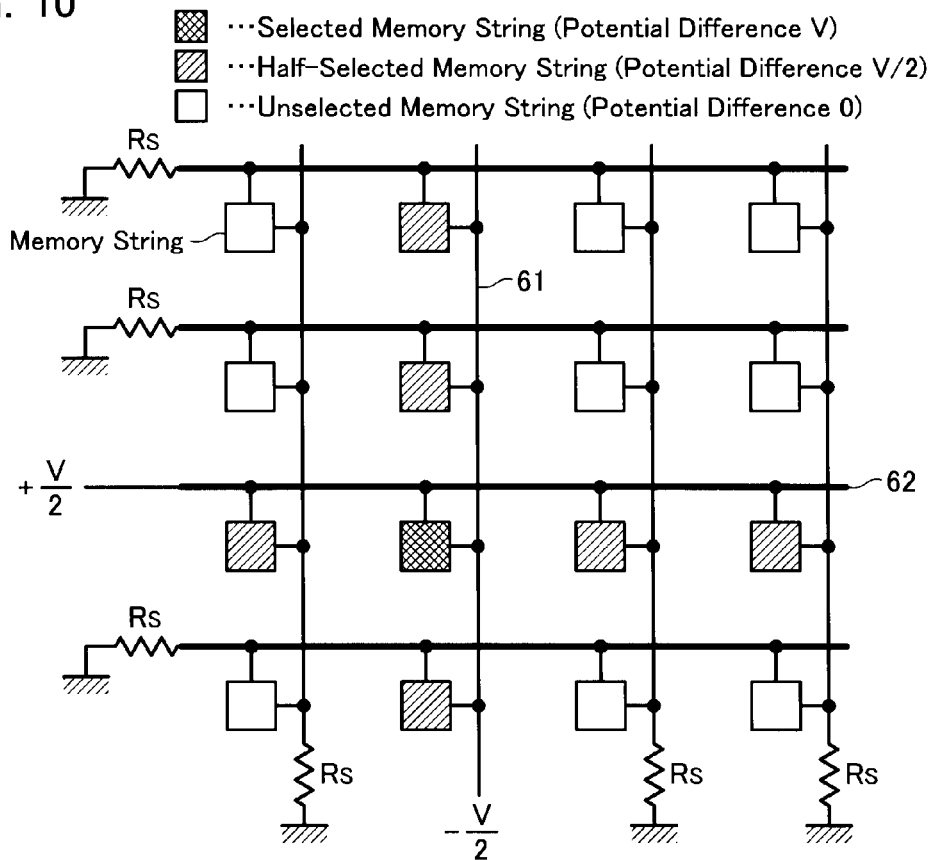
FIG. 10 is a schematic view for explaining operation of the semiconductor memory device in accordance with the second embodiment.
Figure 11:
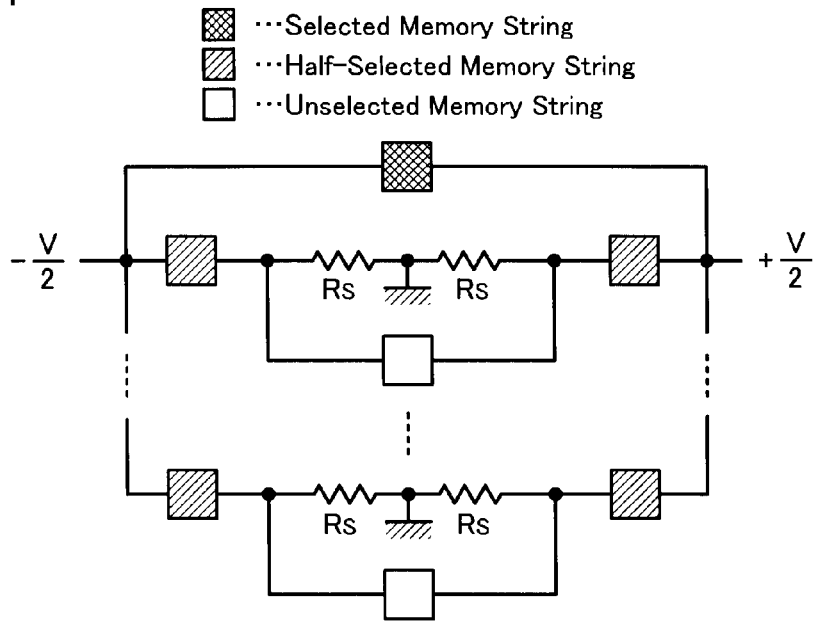
FIG. 11 is a schematic view for explaining operation of the semiconductor memory device in accordance with the second embodiment.
Figure 12:
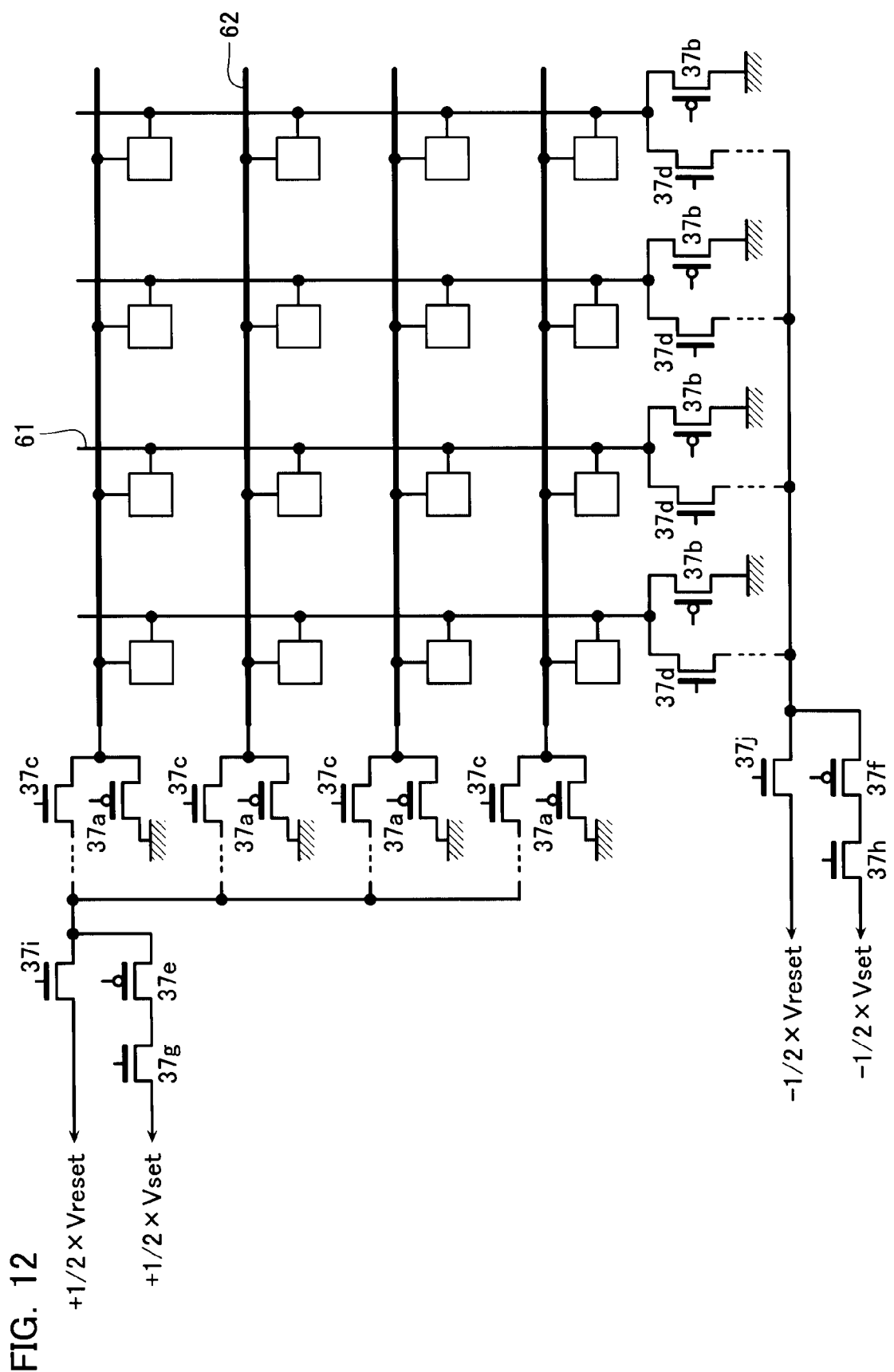
FIG. 12 is a circuit diagram showing a part of the semiconductor memory device in accordance with the second embodiment.

FIGS. 10 and 11 are schematic views for explaining operation of the semiconductor memory device in accordance with the present embodiment. FIGS. 12 and are circuit diagrams showing a part of the semiconductor memory device in accordance with the present embodiment.

Note that to simplify description, a difference Vop−Vs between the voltage Vs applied to the array word line 61 and the voltage Vop applied to the array bit line 62 is expressed as potential difference V.

Further, description proceeds assuming a value of the voltage applied to the array bit line 62 to be V/2 and a value of the voltage applied to the array word line 61 to be –V/2. The voltages applied to each of the portions in FIGS. 10 and 11 are assumed to have values that are smaller overall than the voltages applied to each of the portions in FIGS. 9A to 9C by an amount (Vop−Vs)/2. However, if a difference in voltage applied between each of the lines is the same, the voltage applied to the memory cell MC is the same. As a result, no substantive difference in the description occurs. Consequently, operation of the semiconductor memory device is described below in accordance with FIGS. 10 and 11.

FIG. 10 shows a state in which a selected array bit line 62 is applied with +V/2, a selected array word line 61 is applied with −V/2, and unselected array bit lines 62 and unselected array word lines 61 are connected via a resistance load to a ground potential (0 V). FIG. 11 is an equivalent circuit diagram rewriting this state such that portions of low potential are rearranged to be on the left side and portions of high potential are rearranged to be on the right side.

Although already mentioned, a basic operating principle of write and erase in the memory cell portion is here reconfirmed. The resistance varying material 66 of the memory cell MC used in the present embodiment has characteristics of transiting from a high resistance state (resistance value: $R_H$) to a low resistance state (resistance value: $R_L$) when applied with a voltage greater than or equal to a certain threshold voltage (V0set), and of changing from the low resistance state (resistance value: $R_L$) to the high resistance state (resistance value: $R_H$) upon flow of a current greater than or equal to a certain current (Ireset). Transition from the high resistance state to the low resistance state, and transition from the low resistance state to the high resistance state are here defined as write and erase, respectively. Note that, as mentioned above, the operating voltage Vop is set to the setting voltage Vset during the setting operation and to the resetting voltage Vreset during the resetting operation. Moreover, the description below assumes that the voltage Vs=0. Therefore, during the write operation, the potential difference V between the array word line 61 and array bit line 62 is a potential difference corresponding to the setting voltage Vset. Moreover, during the erase operation, the potential difference V is a potential difference corresponding to the resetting voltage Vreset, and during the read operation, the potential difference V is a potential difference corresponding to the read voltage Vread.

When performing write, the selected array bit line 62 connected to the selected memory string including the memory cell MC subject to write (selected memory cell) is applied with V/2 (=+½×Vset), and the selected array word line 61 is applied with −V/2 (=−½×Vset). Other array word lines 61 and array bit lines are connected, respectively, via a certain resistance $R_S$ which serves as a current limiting element, to a ground line (0 V). Now, the potential difference V (voltage Vset) is set to be greater than a value of the threshold voltage V0set supplemented by a voltage drop due to resistance of the array word line 61, array bit line 62, bit line, and so on, and less than twice the threshold voltage V0set. If the resistance of the array word line 61, array bit line 62, bit line, and so on, is expressed as a resistance $R_{prs}$, then the resistance $R_S$ is set such that $(½)×V/(R_L+R_S+R_{prs})$ is less than Ireset, and such that $R_S/(R_S+R_L+R_{prs})×V$ is less than Ireset×$R_L$. The resistance $R_S$ acting as the current limiting element is not limited to being a fixed resistance using the diffusion layer of the silicon (Si) substrate, and a variable resistance using the fact that the drain current of the MOSFET is limited may also be employed as the resistance $R_S$. Note that to prevent re-erase, the power source supplying the ±½×V is provided with an output resistance $R_{ex}$ acting as a current limiting circuit to prevent the output current exceeding Ireset, and is preferably set such that V/($R_L+R_{ex}+R_{prs}$) is less than Ireset. The resistance $R_{ex}$ is not limited to a fixed resistance using the diffusion layer of the silicon (Si) substrate, and a variable resistance using the fact that the drain current of the MOSFET is limited may also be employed as the resistance $R_{ex}$, similarly to the resistance $R_S$.

The above-described setting causes a voltage greater than or equal to the threshold voltage V0set to be applied to the certain portion 66b of the resistance varying material 66 opposing the selected portion 64b on the bit line 64 (memory string) including the selected memory cell MC. Write to the certain portion 66b of the resistance varying material 66 is thus enabled. In addition, the certain portion 66b of the resistance varying material 66 opposing the selected portion 64b on the bit line 64 (memory string) at intersections where only one of the array word line or the array bit line 62 is selected (hereafter referred to as "half-selected") is only applied with a voltage less than the threshold voltage V0set, thereby preventing execution of an incorrect write, and, moreover, only has a current less than Ireset flowing therein, thereby also preventing execution of an incorrect erase. Furthermore, the certain portion 66b of the resistance varying material 66 opposing the selected portion 64b on the bit line 64 (memory string) at intersections where both the array word line 61 and the array bit line 62 are unselected is applied with a voltage of at most $R_S/(R_S+R_L+R_{prs})×V$, if a plurality of low resistance state cells exist within the same memory cell array. However, from the above-described conditions, execution of an incorrect write and an incorrect erase are prevented, since this voltage does not reach a voltage required for erase (Ireset×$R_L$) or the threshold voltage V0set which is greater than the voltage required for erase.

When performing erase, as shown in FIGS. 10 and 11 and similarly to the case of write, the selected array bit line 62 connected to the memory cell MC subject to erase is applied with V/2 (=+½×Vreset), the selected array word line 61 connected to the memory cell MC subject to erase is applied with −V/2 (=−½×Vreset), and the other array word lines 61 and array bit lines are connected, respectively, via the certain resistance $R_S$ which serves as a current limiting element, to a ground line (0 V). Now, the potential difference V (voltage Vreset) is set to be greater than a value of Ireset×$R_L$ supplemented by a voltage drop due to resistance of the array word line 61, array bit line 62, bit line, and so on, and less than twice Ireset×$R_L$. The resistance $R_S$ is set such that $½×V/(R_L+R_S+R_{prs})$ is less than Ireset, and such that $R_S/(R_S+R_L+R_{prs})×V$ is less than Ireset×$R_L$. The resistance $R_s$ acting as the current limiting element is not limited to being a fixed resistance using the diffusion layer of the silicon (Si) substrate, and a variable resistance using the fact that the drain current of the MOSFET is limited may also be employed as the resistance $R_S$. Note that to prevent re-write, $R_H/(R_H+R_{prs})×$Vreset is naturally set to have a value less than the threshold voltage V0set.

The above-described setting causes a current greater than or equal to Ireset to flow in the certain portion 66b of the resistance varying material 66 opposing the selected portion 64b on the bit line 64 (memory string) at the selected intersection. Erase of the certain portion 66b of the resistance varying material 66 is thus enabled. In addition, the certain portion 66b of the resistance varying material 66 opposing the selected portion 64b on the bit line 64 (memory string) at half-selected intersections only has a current less than Ireset flowing therein, thereby preventing execution of an incorrect erase, and, moreover, is not applied with a voltage greater than the threshold voltage V0set either, thereby also preventing execution of an incorrect write. Furthermore, the certain portion 66b of the resistance varying material 66 adjacent to the selected portion 64b on the bit line 64 (memory string) at intersections where both the array word line 61 and the array bit line 62 are unselected is applied with a voltage of at most $R_S/(R_S+R_L+R_{prs})\times V$, if a plurality of low resistance state cells exist within the same memory cell array. However, from the above-described conditions, execution of an incorrect write and an incorrect erase are prevented, since this voltage does not reach a voltage required for erase (Ireset×$R_L$) or the threshold voltage V0set which is greater than the voltage required for erase.

Further, when performing read, each of the array bit lines 62 has a potential set to 0 V in a state where the bit lines 62 have a current (comparative) detecting circuit connected thereto, and the selected array word line 61 has a potential set to Vread, for example. If the voltage Vread is positive, the current flowing from each of the array bit lines 62 reflects the resistance value of the certain portion 66b of the resistance varying material 66 adjacent to the selected portion 64b on the selected bit line 64 (memory string). If the voltage Vread is negative, the current flowing into each of the array bit lines 62 reflects the resistance value of the certain portion 66b of the resistance varying material 66 adjacent to the selected portion 64b on the selected bit line 64 (memory string). Therefore, comparing these current values with a reference value allows a state of the certain portion 66b of the resistance varying material 66 to be detected.

Note that the applied voltage values of FIGS. 10 and 11 represent only one example, and that, since only the relative value of voltages between each of the electrodes is significant, a combination of (V, +V/2, 0) may be used instead of the combination (+V/2, 0, −V/2) by adding +V/2 overall, for example. There is an advantage in this case that a circuit for generating a negative voltage is not required.

FIG. 12 shows an example where the fixed resistances $R_s$ respectively connected to the array word lines 61 and array bit lines 62 in FIG. 10 are substituted by pMOSFETs 37a and 37b to configure an array bias circuit.

Each of the array bit lines 62 is connected to a ground line (0 V) via the pMOSFET 37a, the pMOSFET 37a configured to be ON when the array bit line 62 is unselected. In addition, an nMOSFET 37c configured to be ON when the array bit line 62 is selected is also connected in parallel with each of the pMOSFETs 37a. Sources of each of the nMOSFETs 37c are commonly connected. An nMOSFET 37i configured to be ON during the erase operation has its drain connected to a common node of the nMOSFETs 37c. The nMOSFET 37i has its source applied with +½×Vreset. Furthermore, an nMOSFET 37g is connected via a pMOSFET 37e functioning as an output resistance to the common node of the nMOSFETs 37c. The nMOSFET 37g has its source applied with +½×Vset and is configured to be ON during write.

Meanwhile, each of the array word lines 61 is connected to a ground line (0 V) via the pMOSFET 37b, the pMOSFET 37b configured to be ON when the array word line 61 is unselected. In addition, an nMOSFET 37d configured to be ON when the array word line 61 is selected is also connected in parallel with each of the pMOSFETs 37b. Sources of each of the nMOSFETs 37d are commonly connected. An nMOSFET 37j configured to be ON during the erase operation has its drain connected to a common node of the nMOSFETs 37d. The nMOSFET 37j has its source applied with −½×Vreset. Furthermore, an nMOSFET 37h is connected via a pMOSFET 37f functioning as an output resistance to the common node of the nMOSFETs 37d. The nMOSFET 37h has its source applied with −½×Vset and is configured to be ON during write.

This configuration uses the gate voltage-controllable pMOSFETs 37a and 37b as current limiting elements and therefore enables a more flexible design to be achieved than the case shown in FIG. 10.

Figure 13:
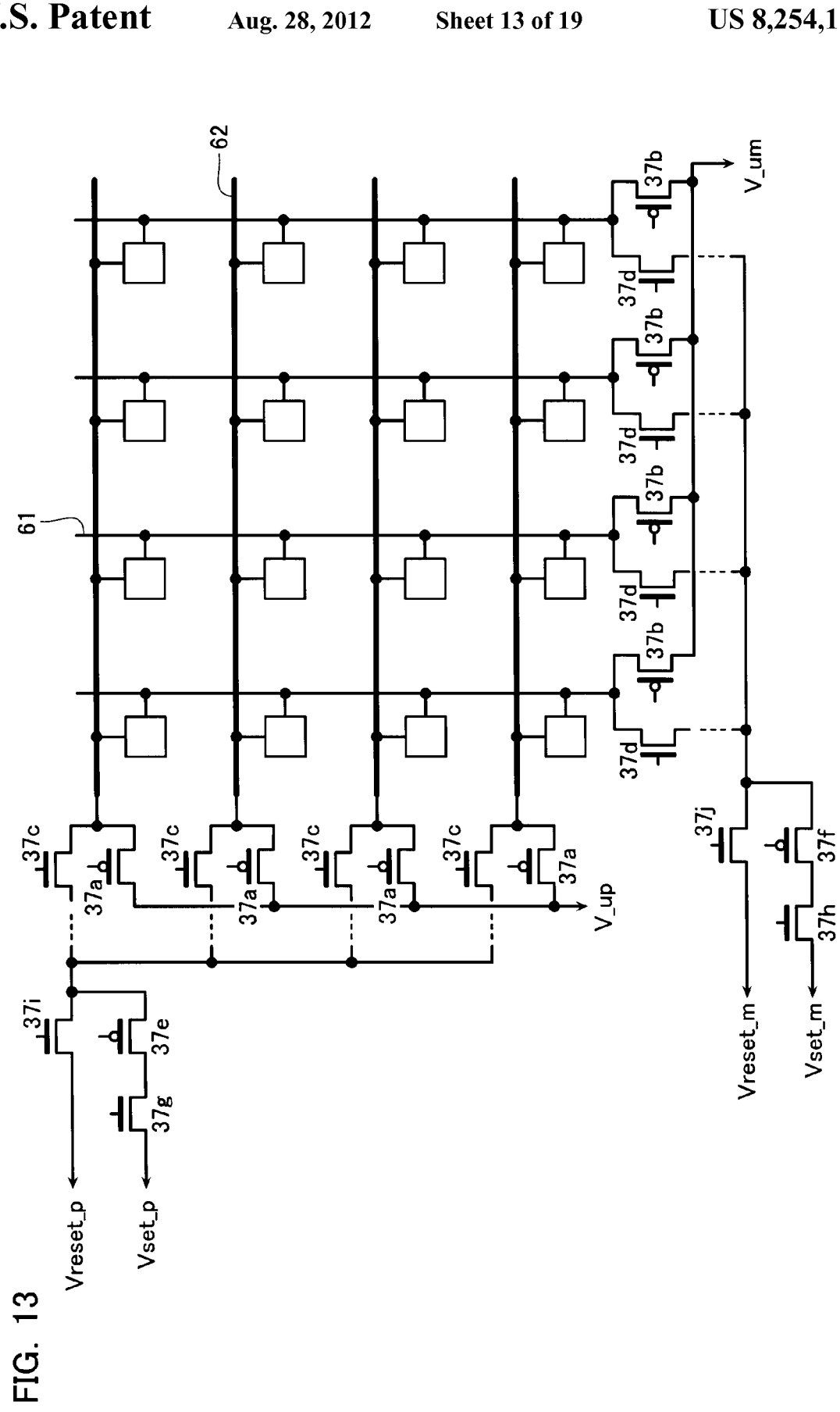
FIG. 13 is a circuit diagram showing a part of the semiconductor memory device in accordance with the second embodiment.

Regarding unselected bias, an offset may be applied with respect to the ground potential enabling overall system power consumption to be reduced. FIG. 13 shows one example of an array bias circuit configured in this case.

FIG. 13 has a circuit configuration which is the same as the memory cell portion shown in FIG. 12, but has applied voltages that are changed. Specifically, the MOSFETs 37a, 37b, 37g, 37h, 37i, and 37j are applied with, respectively, certain voltages V_up, V_um, Vset_p, Vset_m, Vreset_p, and Vreset_m.

If consideration is given to the write operation, each of the voltages need only be related as follows: Vset_p−Vset_m=Vset, Vset_p>V_up, Vset_p>V_um, V_up>Vset_m, V_um>Vset_m. In contrast, if consideration is given to the erase operation, each of the voltages need only be related as follows: Vreset_p−Vreset_m=Vreset, Vreset_p>V_up, Vreset_p>V_um, V_up>Vreset_m, V_um>Vreset_m. Moreover, provided these conditions are satisfied, the magnitude relation of voltages V_up and V_um may be determined arbitrarily.

[Advantages of Semiconductor Memory Device in Accordance with Second Embodiment]

The semiconductor memory device of the present embodiment enables realization of a memory cell array having an extremely simple pattern for the memory cell array and having a structure that does not include difficult-to-form contact holes for each cell. In addition, since the memory cell MC does not include a diode, it becomes possible to suppress power consumption caused by reverse direction leak current of the diodes in unselected memory cells MC. Further, since the line-and-space pattern of the word lines 63 and bit lines 64 can be used to form the MOSFETs, high integration can be achieved at a lower production cost than when NOR-type architecture is employed.

Further, even when the memory cell array is configured three-dimensionally, the word lines 63 to be applied with a voltage can be selected on a layer and row basis, thereby enabling a significant reduction in current flowing in unnecessary portions within the memory cell array. It is therefore possible to achieve a reduction in power consumption and an increase in operating margin.

Third Embodiment

[Configuration of Semiconductor Memory Device in Accordance with Third Embodiment]

Figure 14:
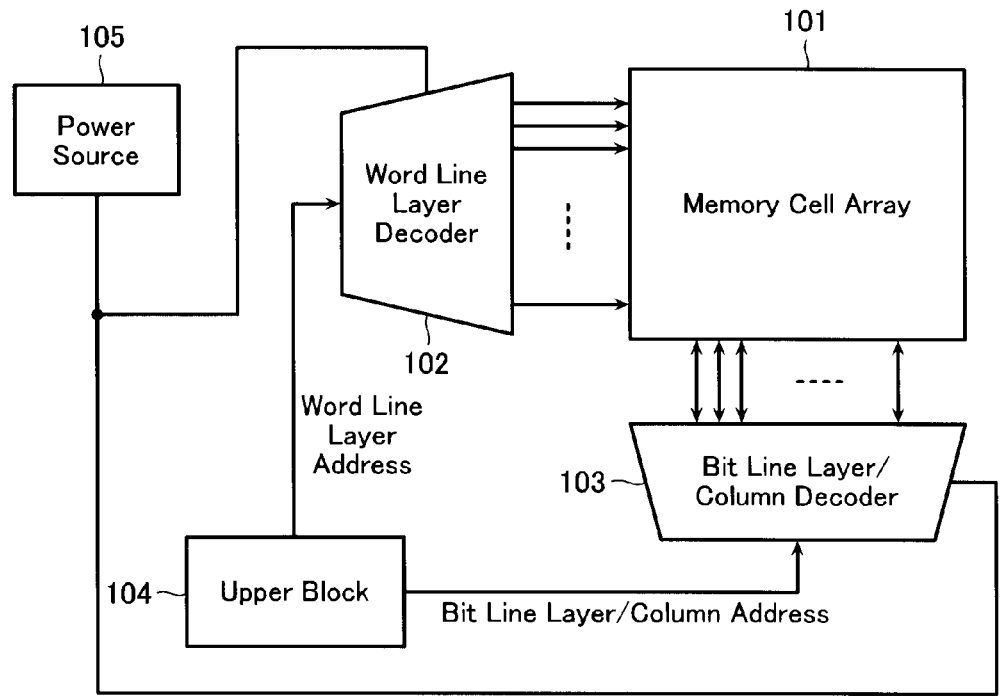
FIG. 14 is a block diagram of a semiconductor memory device in accordance with a third embodiment.

FIG. 14 is a block diagram of a semiconductor memory device in accordance with the present embodiment. This semiconductor memory device includes a memory cell array 101 including a plurality of word lines and a plurality of bit lines intersecting the word lines and having a memory cell MC disposed at respective intersections of the word lines and the bit lines. The memory cell array 101 of the present embodiment differs from the memory cell array 41 of the first embodiment in having the word lines and the bit lines within the memory cell array stacked three-dimensionally. Configurations of these word lines and bit lines are described in detail hereafter.

The semiconductor memory device comprises a word line layer decoder 102 for selecting the word lines of the memory cell array 101 and a bit line layer/column decoder 103 for selecting the bit lines. The bit line layer/column decoder 103 includes drivers for controlling the read, write, and erase operations. In addition, the semiconductor device comprises an upper block 104 which is a control circuit configured to select the word line and the bit line connected to the memory cell MC subject to execution of read and write in the memory cell array 101, and to control each of the operations of read, write, and erase. The upper block 104 supplies a word line layer address and a bit line layer/column address to, respectively, the word line layer decoder 102 and the bit line layer/column decoder 103. A power source 105 generates combinations of certain voltages corresponding to the respective operations of read, write, and erase, and supplies these voltages to the word line layer decoder 102 and the bit line layer/column decoder 103. This configuration makes it possible to read, write, and erase information in all memory cells MC connected to an identical word line of a certain layer in one lot.

Figure 15A:
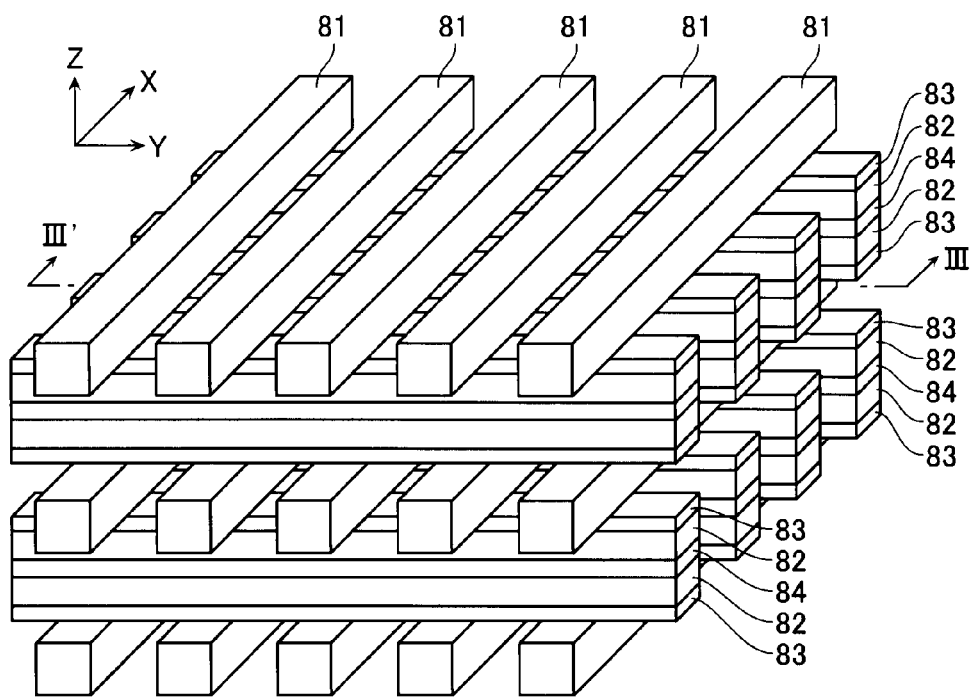
FIG. 15A is a perspective view showing a part of a memory cell array of the semiconductor memory device in accordance with the third embodiment.
Figure 15B:
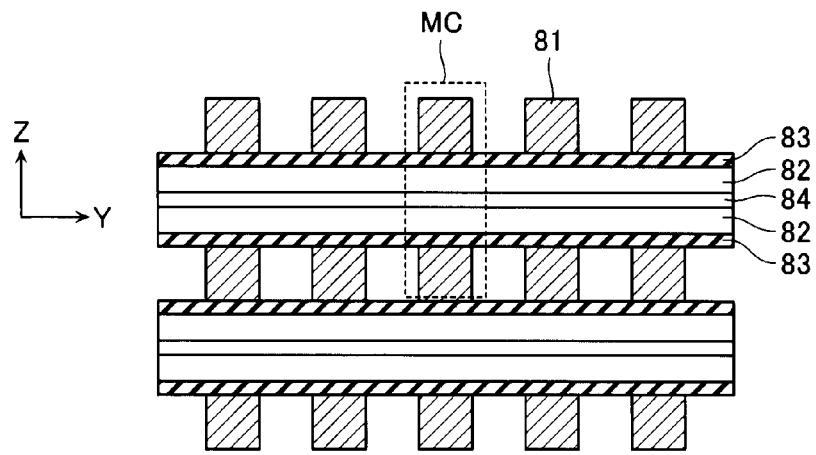
FIG. 15B is a cross-sectional view showing a part of the memory cell array of the semiconductor memory device in accordance with the third embodiment.

FIGS. 15A and 15B are, respectively, a perspective view and a cross-sectional view showing a part of the memory cell array shown in FIG. 14. FIG. 15B is a cross-sectional view taken along the line III-III' of FIG. 15A. Note that interlayer insulating films configured to fill in between each of members are omitted from FIG. 15A.

As shown in FIGS. 15A and 15B, the memory cell array 101 is provided with a plurality of word lines 81 extending in an X direction of FIG. 15A and disposed in parallel in a Y direction and a Z direction of FIG. 15A, and a plurality of bit lines 82 extending in the Y direction and disposed in parallel in the X direction and the Z direction. The bit lines 82 are formed in a column shape sandwiching a thin-film resistance varying material 84 constituted mainly from carbon. There is electrical connection between the bit line 82 and the resistance varying material 84. This column-shaped bit line 82 intersects the word line 81 such that a first side surface is in contact with the resistance varying material 84, while a second side surface opposite to the first side surface opposes the word line 81. Disposed along the bit line 82 on a Z direction side surface of the bit line 82 is an insulating film 83 configured from such as silicon oxide ($SiO_2$). That is, the word line 81 is in contact with the bit line 82 via the insulating film 83.

In the first embodiment, one each of the word lines 1 and the bit lines 2 are disposed having upper and lower portions isolated from other portions by insulating films. However, in the present embodiment, the word lines 81 and the bit lines 82 are disposed alternately in the Z direction perpendicular to the substrate surface, whereby the memory cell array is configured three-dimensionally. Now, the word lines 81 adjacent in the Z direction are formed such that one word line 81 of a certain layer in the Z direction has a separate word line disposed directly above the one word line 81.

The word line 81 is configured from such as silicon (Si) including a high concentration impurity showing a metallic conductivity, and the bit line 82 is configured from a p-type semiconductor silicon (Si) of low impurity concentration. The word line 81, bit line 82, and insulating film 83 form a MOSFET having the word line 81 as a gate electrode and the bit line 82 as a channel.

The MOSFET formed by the word line 81, bit line 82 and insulating film 83, and the resistance varying material 84 formed sandwiched by the bit lines 82 form a single memory cell MC. In the present embodiment, as shown by a broken line in FIG. 15B, the single memory cell MC is configured by the two opposing MOSFETs sandwiching the resistance varying material 84 and the resistance varying material 84 sandwiched between those two MOSFETs. A plurality of the memory cells MC are connected in series in the Y direction to configure a memory string.

Additionally in the present embodiment, due to the resistance varying material 84 being disposed sandwiched by the bit lines 82 (the resistance varying material 84 being isolated from the word line 81 by the bit line 82), the electric field formed by the word line 81 is partially shielded by the bit line 82. In such a structure, an influence of the voltage applied to the word line 81 on the resistance varying material 84 is limited. In FIGS. 15A and 15B, space between each of the word lines 81 and bit lines 82 is filled in by an insulating film. Accordingly, the resistance varying material 84 provided sandwiched by the bit lines 82 is in contact with the insulating film at X direction side surfaces.

As shown in FIG. 15A, the semiconductor memory device of the present embodiment is configured having the word lines 81 and bit lines 82 in an orthogonal positional relationship. In the case of this configuration, the word lines 81 and the bit lines 82 need only have line-and-space patterns that are orthogonal, and there is no need to consider misalignment in the X direction and Y direction. It is thus possible for alignment accuracy in the memory cell array in a manufacturing process to be relaxed to a high degree, whereby manufacturing can be easily performed. Further, utilizing this kind of three-dimensional structure enables realization of an ultrahigh integration structure in which multiple-bit information can be stored in a $4F^2$ region.

[Operation of Semiconductor Memory Device in Accordance with Third Embodiment]

In the semiconductor memory device of the present embodiment formed as above, a MOSFET is used to select one specific memory cell MC only from a plurality of memory cells MC aligned in series in the bit line direction, and read, write, and erase operations are executed on that selected memory cell MC only, similarly to previous embodiments. Additionally in the present embodiment, a part of the resistance varying material 84 is in contact with the interlayer insulating film and is not completely surrounded by the bit line 82. As a result, the resistance varying material 84 is applied not only with a main electric field applied directly from the bit line 82 based on the voltage difference between the operating voltage Vop and the reference voltage Vs but is also indirectly applied with an auxiliary electric field (leak electric field) from the word line 81 via the interlayer insulating film.

[Other Configuration Example of Semiconductor Memory Device in Accordance with Third Embodiment]

Figure 16A:
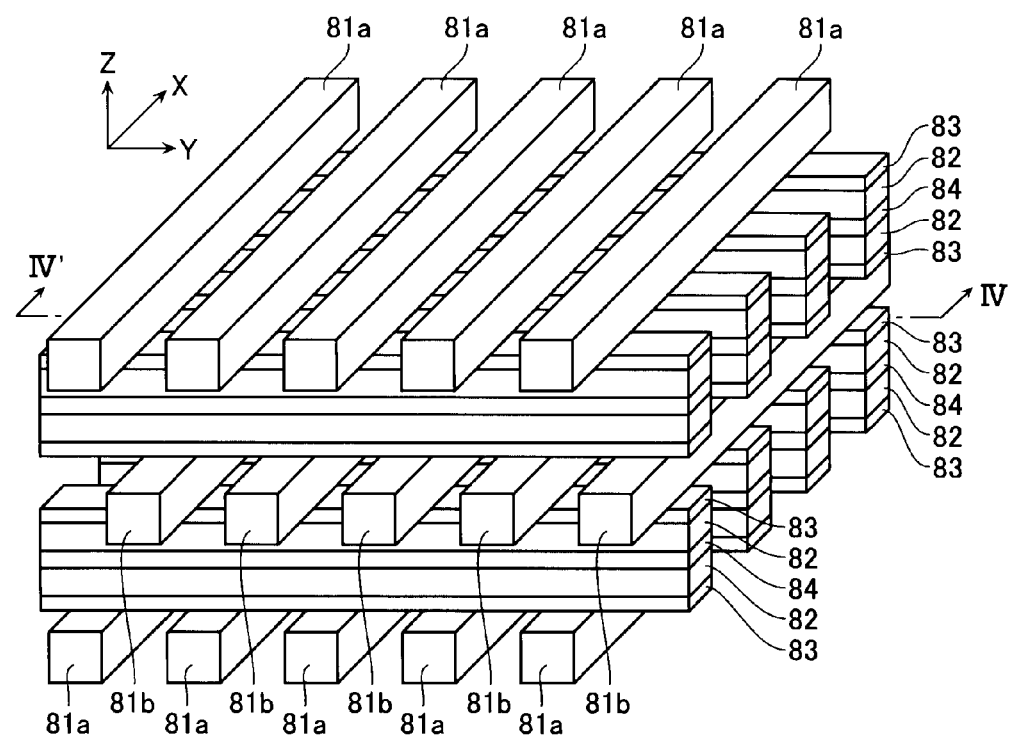
FIG. 16A is a perspective view showing a part of the memory cell array of the semiconductor memory device in accordance with the third embodiment.
Figure 16B:
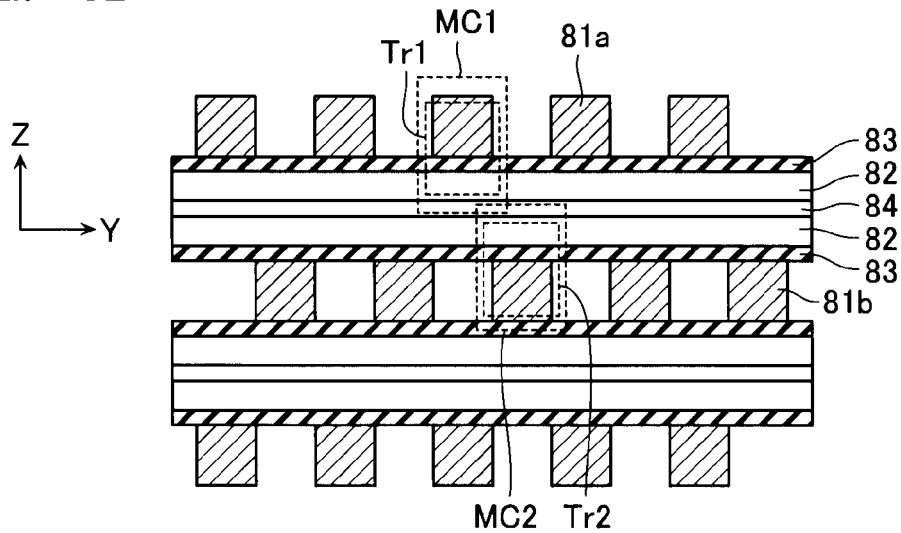
FIG. 16B is a cross-sectional view showing a part of the memory cell array of the semiconductor memory device in accordance with the third embodiment.

FIGS. 16A and 16B are, respectively, a perspective view and a cross-sectional view showing a part of another configuration example of the memory cell array of the present embodiment. FIG. 16B is a cross-sectional view taken along the line IV-IV' of FIG. 16A. Note that interlayer insulating films configured to fill in between each of members are omitted from FIG. 16A.

The memory cell array shown in FIGS. 16A and 16B differs from the memory cell array shown in FIGS. 15A and 15B in having a line formation portion and a space portion of the word lines 81 in each of the layers in the Z direction perpendicular to the substrate formed staggered on a layer-by-layer basis. The memory cell array shown in FIGS. 16A and 16B has a layer where word lines 81a are formed and a layer where word lines 81b are formed stacked alternately. The word lines 81a and the word lines 81b have their line patterns out of alignment by a half-pitch amount. That is, the memory cell array is formed such that there is no word line 81 disposed directly above where a word line 81 is formed in a certain layer in the Z direction, and, moreover, such that there is a word line 81 disposed directly above where there is no word line 81 formed in a certain layer in the Z direction.

The word line 81 is configured from such as silicon (Si) including a high concentration impurity showing a metallic conductivity, and the bit line 82 is configured from a p-type semiconductor silicon (Si) of low impurity concentration. The word line 81, bit line 82, and insulating film 83 form a MOSFET having the word line 81 as a gate electrode and the bit line 82 as a channel.

The MOSFET formed by the word line 81, bit line 82 and insulating film 83, and the resistance varying material 84 formed sandwiched by the bit lines 82 form a single memory cell MC. In the present example, the word lines 81 are formed having the line formation portion and the space portion staggered in each layer. Therefore, as shown by broken lines in FIG. 16B, a single memory cell MC1 is configured by a single MOSFET (Tr1) formed by the word line 81, bit line 82 and insulating film 83, and by the resistance varying material 84 provided on an opposite side of the word line 81 with the bit line 82 sandwiched therebetween. The two MOSFETs (Tr1 and Tr2) configuring the two adjacent memory cells MC1 and MC2 are formed, respectively, in the two facing layers sandwiching the resistance varying material 84. A plurality of the memory cells MC are connected in series in the Y direction to configure a memory string.

Additionally in the present example, due to the resistance varying material 84 being disposed sandwiched by the bit lines 82 (the resistance varying material 84 being isolated from the word line 81 by the bit line 82), the electric field formed by the word line 81 is partially shielded by the bit line 82. In such a structure, an influence of the voltage applied to the word line 81 on the resistance varying material 84 is limited. In FIGS. 16A and 16B, space between each of the word lines 81 and bit lines 82 is filled in by an insulating film. Accordingly, the resistance varying material 84 provided sandwiched by the bit lines 82 is in contact with the insulating film at X direction side surfaces.

As shown in FIG. 16A, the semiconductor memory device of the present embodiment is configured having the word lines 81 and bit lines 82 in an orthogonal positional relationship. In the case of this configuration, the word lines 81 and the bit lines 82 need only have line-and-space patterns that are orthogonal, and there is no need to consider misalignment in the X direction and Y direction. It is thus possible for alignment accuracy in the memory cell array in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

Figure 17A:
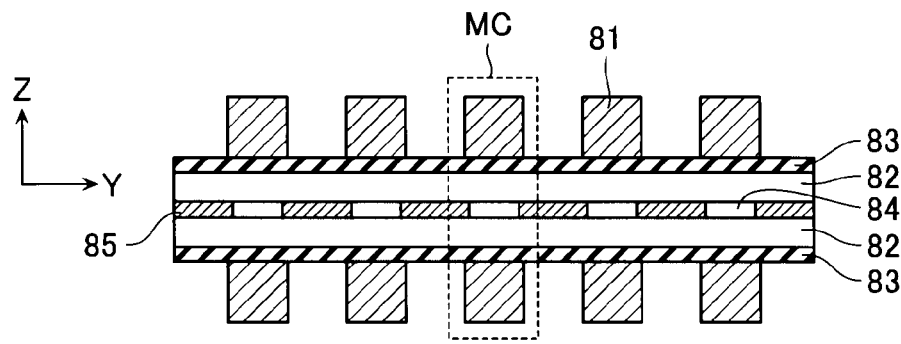
FIG. 17A is a cross-sectional view showing a part of the memory cell array of the semiconductor memory device in accordance with the third embodiment.
Figure 17B:
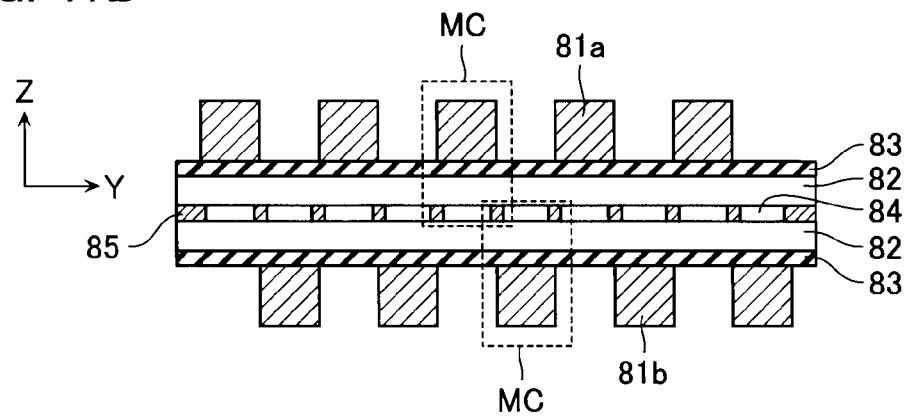
FIG. 17B is a cross-sectional view showing a part of the memory cell array of the semiconductor memory device in accordance with the third embodiment.

In addition, in the configuration examples of FIGS. 15A to 16B, the resistance varying material 84 is formed in a single thin film continuous in the Y direction. However, the resistance varying material 84 does not need to be formed continuously. FIGS. 17A and 17B are cross-sectional views of portions corresponding to FIGS. 15B and 16B, respectively. As shown in the cross-sectional views of FIGS. 17A and 17B, the resistance varying material 84 may be provided only in a portion where the memory cell MC is formed, the space between the resistance varying material 84 between the memory cells being connected by a conductor 85.

Fourth Embodiment

[Configuration of Semiconductor Memory Device in Accordance with Fourth Embodiment]

Figure 18:
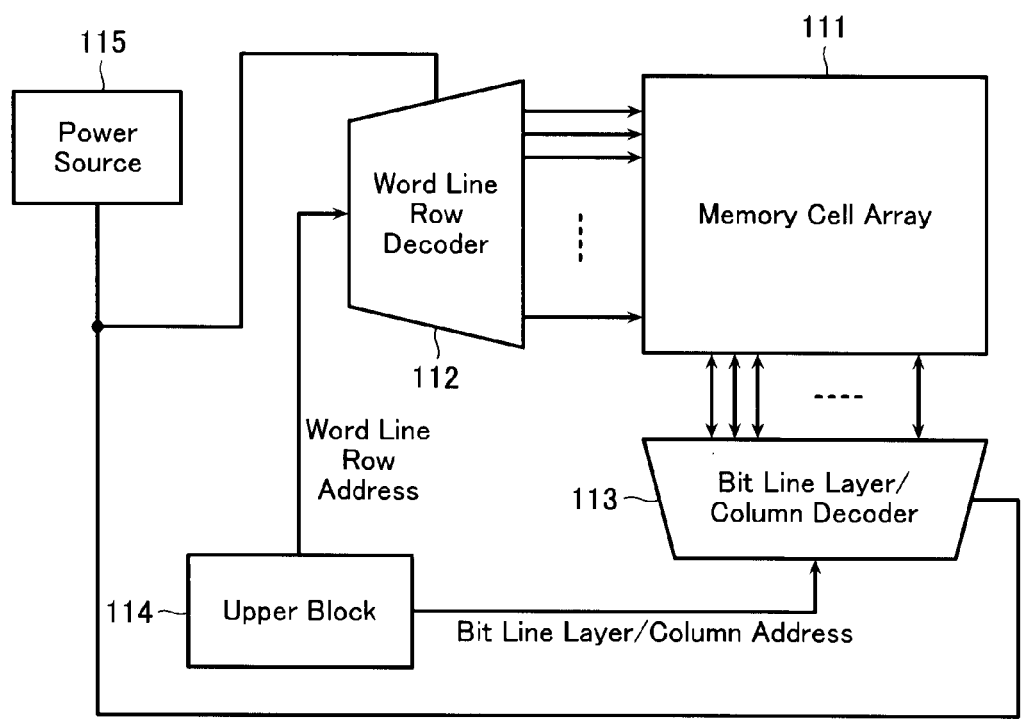
FIG. 18 is a block diagram of a semiconductor memory device in accordance with a fourth embodiment.

FIG. 18 is a block diagram of a semiconductor memory device in accordance with the present embodiment. This semiconductor memory device includes a memory cell array 111 including a plurality of word lines and a plurality of bit lines intersecting the word lines and having a memory cell MC disposed at respective intersections of the word lines and the bit lines. The memory cell array 111 of the present embodiment differs from the memory cell array 41 of the first embodiment in having the word lines and the bit lines within the memory cell array stacked three-dimensionally. Configurations of these word lines and bit lines are described in detail hereafter.

The semiconductor memory device comprises a word line row decoder 112 for selecting the word lines of the memory cell array 111 and a bit line layer/column decoder 113 for selecting the bit lines. The bit line layer/column decoder 113 includes drivers for controlling the read, write, and erase operations. In addition, the semiconductor memory device comprises an upper block 114 which is a control circuit configured to select the word line and the bit line connected to the memory cell MC subject to execution of read and write in the memory cell array 111, and to control each of the operations of read, write, and erase. The upper block 114 supplies a word line row address and a bit line layer/column address to, respectively, the word line row decoder 112 and the bit line layer/column decoder 113. A power source 115 generates combinations of certain voltages corresponding to the respective operations of read, write, and erase, and supplies these voltages to the word line row decoder 112 and the bit line layer/column decoder 113. This configuration makes it possible to read, write, and erase information in all memory cells MC connected to a certain identical word line.

Figure 19A:
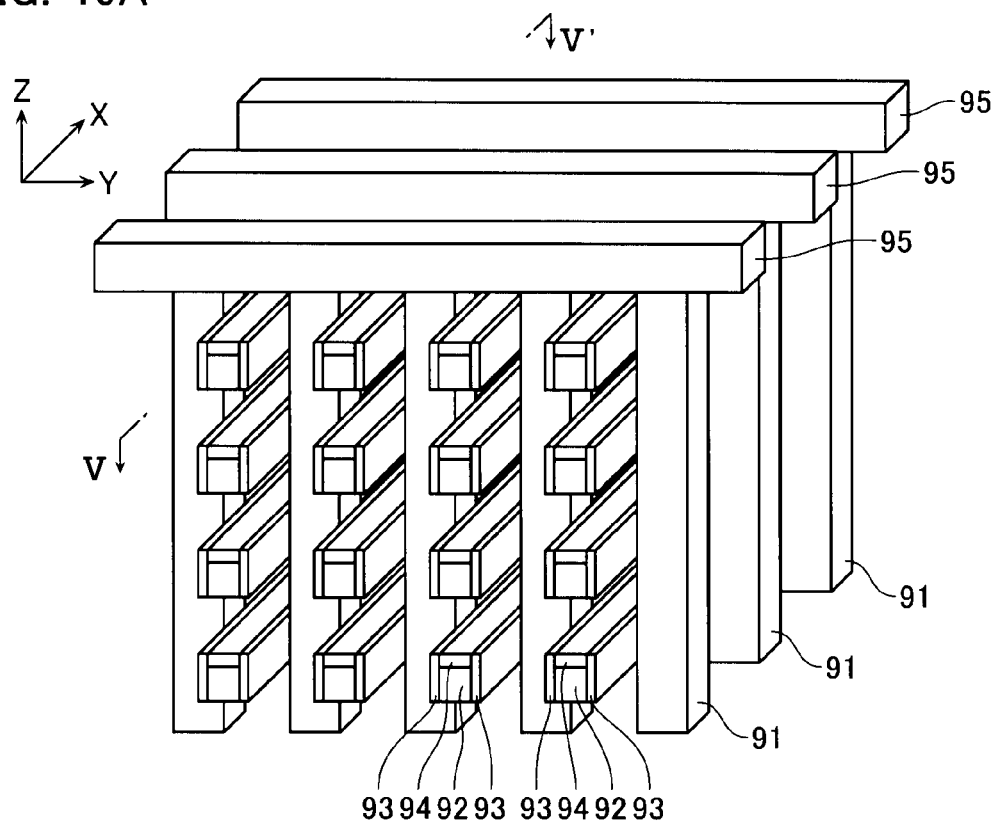
FIG. 19A is a perspective view showing a part of a memory cell array of the semiconductor memory device in accordance with the fourth embodiment.
Figure 19B:
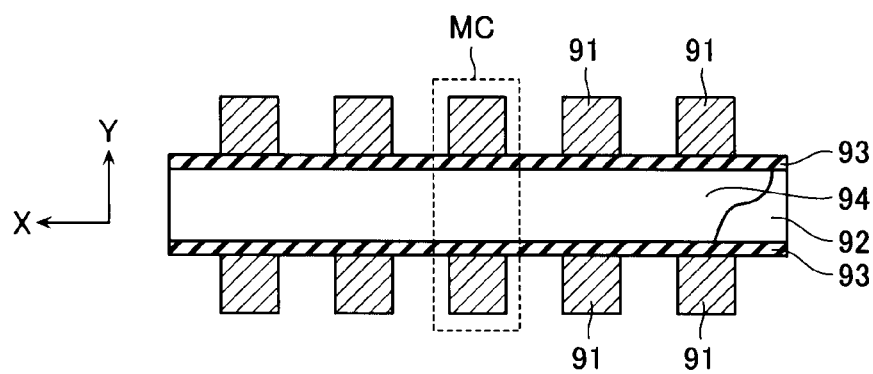
FIG. 19B is a cross-sectional view showing a part of the memory cell array of the semiconductor memory device in accordance with the fourth embodiment.

FIGS. 19A and 19B are, respectively, a perspective view and a cross-sectional view showing a part of the memory cell array shown in FIG. 18. FIG. 19B is a cross-sectional view taken along the line V-V' of FIG. 19A. Note that interlayer insulating films configured to fill in between each of members are omitted from FIG. 19A.

As shown in FIGS. 19A and 19B, the memory cell array 111 is provided with a plurality of word lines 91 extending in a Z direction of FIG. 19A and disposed in parallel in an X direction and a Y direction of FIG. 19A, and a plurality of bit lines 92 extending in the X direction and disposed in parallel in the Y direction and the Z direction. Formed on one side surface in the Z direction of the bit line 92 is a thin-film resistance varying material 94 constituted mainly from carbon. There is electrical connection between the bit line 92 and the resistance varying material 94. This bit line 92 intersects the word line 91 such that a side surface (Y direction side surface in FIGS. 19A and 19B) adjacent to a surface with which the resistance varying material 94 is in contact opposes the word line 91. Disposed along the bit line 92 on the Y direction side surface of the bit line 92 is an insulating film 93 configured from such as silicon oxide ($SiO_2$). That is, the word line 91 is in contact with the bit line 92 via the insulating film 93.

Furthermore, connected to upper ends in the Z direction of the word lines 91 are a plurality of upper word lines 95 extending in the Y direction and disposed in parallel in the X direction. These upper word lines 95 allow a plurality of word lines 91 aligned in the Y direction to be applied with an identical voltage.

In the first embodiment, one each of the word lines 1 and the bit lines 2 are disposed having upper and lower portions isolated from other portions by insulating films. However, in the present embodiment, the word lines 91 and the bit lines 92 are disposed alternately in the Y direction, whereby the memory cell array is configured three-dimensionally.

The word line 91 is configured from such as silicon (Si) including a high concentration impurity showing a metallic conductivity, and the bit line 92 is configured from a p-type semiconductor silicon (Si) of low impurity concentration. The word line 91, bit line 92, and insulating film 93 form a MOSFET having the word line 91 as a gate electrode and the bit line 92 as a channel.

The MOSFET formed by the word line 91, bit line 92 and insulating film 93, and the resistance varying material 94 formed on the side surface of the bit line form a single memory cell MC. In the previously described embodiments, the resistance varying material is formed on a surface on an opposite side to the word line, which word line acts as the gate electrode in the MOSFET configuring the memory cell MC. However, in the present embodiment, the resistance varying material 94 is formed on one side surface in the Z direction perpendicular to the substrate of the bit line 92, which bit line 92 acts as the channel. In the present embodiment, as shown by a broken line in FIG. 19B, the single memory cell MC is configured by two MOSFETs opposing in the Y direction and the resistance varying material 94 formed on the one side surface in the Z direction of the channel of the two MOSFETs. A plurality of the memory cells MC are connected in series in the X direction to configure a memory string. Note that in FIG. 19B, the resistance varying material 94 is shown having a part thereof removed to render the bit line 92 visible.

In FIGS. 19A and 19B, space between each of the word lines 91 and bit lines 92 is filled in by an insulating film. As a result, the resistance varying material 94 formed on the side surface of the bit line 92 is in contact with the insulating film.

As shown in FIG. 19A, the semiconductor memory device of the present embodiment is configured having the word lines 91 and bit lines 92 in an orthogonal positional relationship. In the case of this configuration, the word lines 91 and the bit lines 92 need only have line-and-space patterns that are orthogonal, and there is no need to consider misalignment. It is thus possible for alignment accuracy in the memory cell array in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

[Operation of Semiconductor Memory Device in Accordance with Fourth Embodiment]

In the semiconductor memory device of the present embodiment formed as above, a MOSFET is used to select one specific memory cell MC only from a plurality of memory cells MC aligned in series in the bit line direction, and read, write, and erase operations are executed on that selected memory cell MC only, similarly to previous embodiments. Additionally in the present embodiment, a part of the resistance varying material 94 is in contact with the interlayer insulating film and is not completely surrounded by the bit line 92. As a result, the resistance varying material 94 is applied not only with a main electric field applied directly from the bit line 92 based on the voltage difference between the operating voltage Vop and the reference voltage Vs but is also indirectly applied with an auxiliary electric field (leak electric field) from the word line 91 via the interlayer insulating film.

[Other Configuration Example of Semiconductor Memory Device in Accordance with Fourth Embodiment]

Figure 20A:
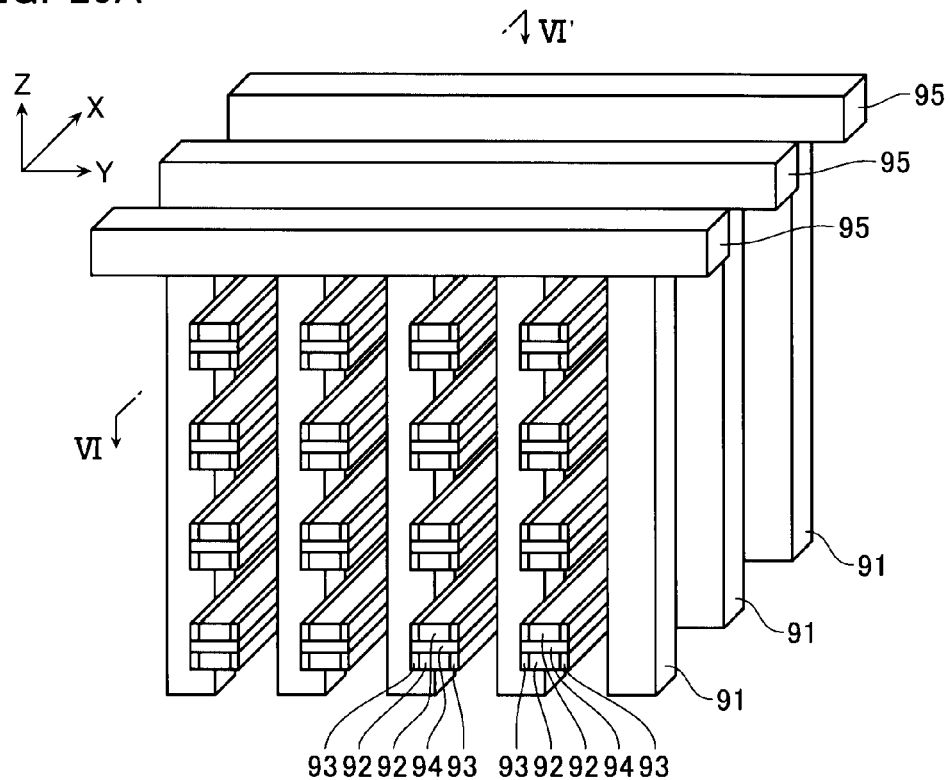
FIG. 20A is a perspective view showing a part of the memory cell array of the semiconductor memory device in accordance with the fourth embodiment.
Figure 20B:
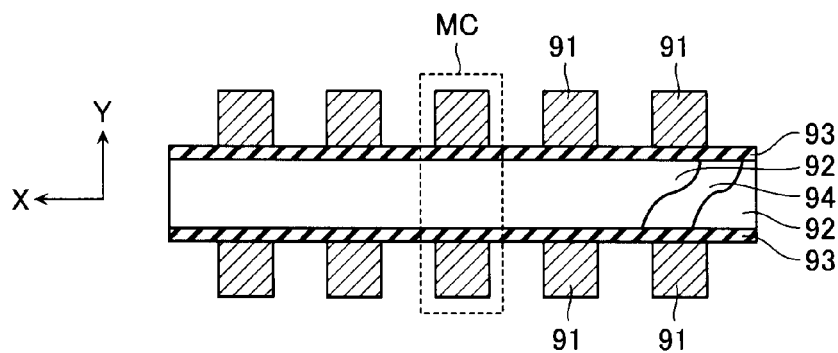
FIG. 20B is a cross-sectional view showing a part of the memory cell array of the semiconductor memory device in accordance with the fourth embodiment.

FIGS. 20A and 20B are, respectively, a perspective view and a cross-sectional view showing a part of another configuration example of the memory cell array of the present embodiment. FIG. 20B is a cross-sectional view taken along the line VI-VI' of FIG. 20A. Note that interlayer insulating films configured to fill in between each of members are omitted from FIG. 20A.

The memory cell array shown in FIGS. 20A and 20B differs from the memory cell array shown in FIGS. 19A and 19B in having the resistance varying material 94 formed sandwiched by the bit lines 92. The resistance varying material 94 is sandwiched between the bit lines 92 such that the bit line 92, the resistance varying material 94, and the bit line 92 are stacked sequentially in the Z direction perpendicular to the substrate.

The word line 91 is configured from such as silicon (Si) including a high concentration impurity showing a metallic conductivity, and the bit line 92 is configured from a p-type semiconductor silicon (Si) of low impurity concentration. The word line 91, bit line 92, and insulating film 93 form a MOSFET having the word line 91 as a gate electrode and the bit line 92 as a channel.

The MOSFET formed by the word line 91, bit line 92 and insulating film 93, and the resistance varying material 94 formed sandwiched by the bit lines 92 form a single memory cell MC. In the present embodiment, as shown by a broken line in FIG. 20B, the single memory cell MC is configured by MOSFETs opposing in the Y direction and by the resistance varying material 94 formed sandwiched by the channel of the MOSFETs. A plurality of the memory cells MC are connected in series in the X direction to configure a memory string. Note that in FIG. 20B, the bit line 92 and the resistance varying material 94 are shown having parts thereof removed.

In FIGS. 20A and 20B, space between each of the word lines 91 and bit lines 92 is filled in by an insulating film. As a result, the resistance varying material 94 formed sandwiched by the bit lines 92 is in contact with the insulating film at a side surface (side surface in the Y direction of FIGS. 20A and 20B) on a side where the bit line 92 opposes the word line 91.

As shown in FIG. 20A, the semiconductor memory device of the present example is also configured having the word lines 91 and bit lines 92 in an orthogonal positional relationship. In the case of this configuration, the word lines 91 and the bit lines 92 need only have line-and-space patterns that are orthogonal, and there is no need to consider misalignment. It is thus possible for alignment accuracy in the memory cell array in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

Other Embodiments

This concludes description of the embodiments of the present invention, but it should be noted that the present invention is not limited to the above-described embodiments, and that various alterations, additions, combinations, and so on, are possible within a range not departing from the scope and spirit of the invention. For example, in the embodiments, a material constituted mainly from carbon is employed as the resistance varying material used in memory operations, but other materials such as NiO, HfO, $TiO_2$, $SrZrO_3$, $ZnMn_2O_4$, and $Pr_{0.7}Ca_{0.3}MnO_3$ may also be employed. Furthermore, a phase change memory element which is configured to transit between a high resistance state and a low resistance state by phase-change may be employed as the resistance varying material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate;
a plurality of word lines extending in a first direction parallel to a surface of the semiconductor substrate and disposed in parallel in a second direction parallel to the surface of the semiconductor substrate and orthogonal to the first direction;
a plurality of bit lines extending in the second direction and disposed in parallel in the first direction to intersect the word lines;
an insulating film disposed at each of intersections of the word lines and the bit lines;
an interlayer insulating film configured to fill a gap between the word lines and a gap between the bit lines; and
a resistance varying material formed to extend in the second direction and configured to be electrically connected to the bit lines and to change between a low resistance state and a high resistance state,
the word lines, the bit lines and the insulating film configuring a field-effect transistor at each of the intersections of the word lines and the bit lines, the field-effect transistor having one of the word lines as a control electrode and one of the bit lines as a channel region,
the field-effect transistor and the resistance varying material configuring a memory cell having the field-effect transistor and the resistance varying material connected in parallel to the field-effect transistor, and
each of the bit lines including a first surface opposing the word lines with the insulating film interposed therebetween, and a second surface on an opposite side to the first surface, the resistance varying material being disposed in contact with the second surface and the resistance varying material having a portion thereof in contact with the interlayer insulating film.

2. The semiconductor memory device according to claim 1, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain read voltage to a selected one of the bit lines selected by the bit line decoder; and
a data read unit configured to detect a current flowing in the selected one of the bit lines, and to detect as data a resistance state of the resistance varying material of the memory cell configured at an intersection of the selected one of the word lines and the selected one of the bit lines.

3. The semiconductor memory device according to claim 1, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain write voltage or a certain erase voltage to a selected one of the bit lines selected by the bit line decoder; and
a data write/erase unit configured to change a resistance state of the resistance varying material of the memory cell configured at an intersection of the selected one of the word lines and the selected one of the bit lines.

4. The semiconductor memory device according to claim 3, wherein
a source-drain breakdown voltage of the field-effect transistor is larger than a voltage value of the write voltage and the erase voltage.

5. The semiconductor memory device according to claim 1, wherein
a channel resistance value of the field-effect transistor is smaller than a resistance value of the resistance varying material of the low resistance state.

6. The semiconductor memory device according to claim 1, wherein
the field-effect transistor is of a normally-off enhancement type.

7. A semiconductor memory device, comprising:
a semiconductor substrate;
a plurality of word lines extending in a first direction and disposed in parallel in a second direction orthogonal to the first direction;
a plurality of bit lines extending in the second direction and disposed in parallel in the first direction to intersect the word lines;
an insulating film disposed at each of intersections of the word lines and the bit lines;
an interlayer insulating film configured to fill a gap between the word lines and a gap between the bit lines; and
a resistance varying material formed to extend in the second direction and configured to be electrically connected to the bit lines and to change between a low resistance state and a high resistance state,
the word lines and the bit lines being disposed alternately in a third direction orthogonal to the first direction and the second direction,
the word lines, the bit lines and the insulating film configuring a field-effect transistor at each of the intersections of the word lines and the bit lines, the field-effect transistor having one of the word lines as a control electrode and one of the bit lines as a channel region,
the field-effect transistor and the resistance varying material configuring a memory cell having the field-effect transistor and the resistance varying material connected in parallel to the field-effect transistor, and
the resistance varying material being disposed sandwiched by the bit lines, and, on a side surface of the bit lines facing in the first direction, the resistance varying material having a portion thereof in contact with the interlayer insulating film.

8. The semiconductor memory device according to claim 7, wherein
the first direction and the third direction are directions parallel to a surface of the semiconductor substrate,
the second direction is a stacking direction perpendicular to the semiconductor substrate, and
a plurality of the word lines and the bit lines are disposed in parallel also in the third direction.

9. The semiconductor memory device according to claim 8, further comprising:
a plurality of array word lines extending in the first direction, disposed in parallel in the third direction, and commonly connected to one ends of the bit lines;

a plurality of array bit lines extending in the third direction, disposed in parallel in the first direction, and commonly connected to other ends of the bit lines.

10. The semiconductor memory device according to claim 7, wherein
the first direction and the second direction are directions parallel to a surface of the semiconductor substrate, and
the third direction is a stacking direction perpendicular to the semiconductor substrate.

11. The semiconductor memory device according to claim 10, wherein
a pattern of a line formation portion and a space portion of the word lines disposed in each of layers in the third direction is staggered in each of the layers.

12. The semiconductor memory device according to claim 7, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain read voltage to a selected one of the bit lines selected by the bit line decoder; and
a data read unit configured to detect a current flowing in the selected one of the bit lines, and to detect as data a resistance state of the resistance varying material of the memory cell configured at an intersection of the selected one of the word lines and the selected one of the bit lines.

13. The semiconductor memory device according to claim 7, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain write voltage or a certain erase voltage to a selected one of the bit lines selected by the bit line decoder; and
a data write/erase unit configured to change a resistance state of the resistance varying material of the memory cell configured at an intersection of the selected one of the word lines and the selected one of the bit lines.

14. The semiconductor memory device according to claim 7, wherein
the field-effect transistor is of a normally-off enhancement type.

15. A semiconductor memory device, comprising:
a semiconductor substrate;
a plurality of word lines extending in a stacking direction perpendicular to a surface of the semiconductor substrate, the word lines being disposed in parallel in a first direction and a second direction, respectively, the first direction being parallel to the surface of the semiconductor substrate, and the second direction being parallel to the surface of the semiconductor substrate and orthogonal to the first direction;
a plurality of bit lines extending in the first direction to intersect the word lines, the bit lines being disposed in parallel in the second direction and the stacking direction, respectively;
an insulating film disposed at each of intersections of the word lines and the bit lines;
an interlayer insulating film configured to fill a gap between the word lines and a gap between the bit lines; and
a resistance varying material formed to extend in the first direction and configured to be electrically connected to the bit lines and to change between a low resistance state and a high resistance state,
the word lines and the bit lines being disposed alternately in the second direction,
the word lines, the bit lines and the insulating film configuring a field-effect transistor at each of the intersections of the word lines and the bit lines, the field-effect transistor having one of the word lines as a control electrode and one of the bit lines as a channel region,
the field-effect transistor and the resistance varying material configuring a memory cell having the field-effect transistor and the resistance varying material connected in parallel to the field-effect transistor, and
the resistance varying material having a portion thereof in contact with the interlayer insulating film.

16. The semiconductor memory device according to claim 15, wherein
the resistance varying material is disposed on a side surface of the bit lines facing in the stacking direction.

17. The semiconductor memory device according to claim 15, wherein
the resistance varying material is disposed sandwiched by the bit lines, and in contact with the interlayer insulating film on a side surface facing in the second direction.

18. The semiconductor memory device according to claim 15, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain read voltage to a selected one of the bit lines selected by the bit line decoder; and
a data read unit configured to detect a current flowing in the selected one of the bit lines, and to detect as data a resistance state of the resistance varying material of the memory cell configured at an intersection of the selected one of the word lines and the selected one of the bit lines.

19. The semiconductor memory device according to claim 15, further comprising:
a word line decoder for selecting the word lines;
a bit line decoder for selecting the bit lines;
a power source unit configured to apply a certain voltage to a selected one of the word lines selected by the word line decoder and a certain voltage to an unselected one of the word lines not selected by the word line decoder, and to apply a certain write voltage or a certain erase voltage to a selected one of the bit lines selected by the bit line decoder; and
a data write/erase unit configured to change a resistance state of the resistance varying material of the memory cell configured at an intersection of the selected one of the word lines and the selected one of the bit lines.

20. The semiconductor memory device according to claim 15, wherein
the field-effect transistor is of a normally-off enhancement type.

* * * * *